(12) United States Patent
Mopidevi et al.

(10) Patent No.: US 10,354,838 B1
(45) Date of Patent: Jul. 16, 2019

(54) RF ANTENNA PRODUCING A UNIFORM NEAR-FIELD POYNTING VECTOR

(71) Applicant: Lam Research Corporation, Fremont, CA (US)

(72) Inventors: Hema Swaroop Mopidevi, Fremont, CA (US); Lee Chen, Cedar Creek, TX (US); Thomas W. Anderson, Hayward, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/156,837

(22) Filed: Oct. 10, 2018

(51) Int. Cl.
*H01J 37/32* (2006.01)
*H01L 21/67* (2006.01)
*H01L 21/683* (2006.01)
*C23C 16/505* (2006.01)

(52) U.S. Cl.
CPC ..... *H01J 37/3211* (2013.01); *H01J 37/32183* (2013.01); *H01L 21/67069* (2013.01); *H01L 21/6831* (2013.01); *C23C 16/505* (2013.01); *H01J 37/32119* (2013.01); *H01J 2237/332* (2013.01); *H01J 2237/334* (2013.01)

(58) Field of Classification Search
CPC .... A61N 2005/1087; A61N 2005/1061; A61N 2005/1059; A61N 5/1049; A61N 5/1064; A61N 5/1067; A61N 2005/0641; A61N 5/10; A61N 5/1042; A61N 5/1043; A61N 5/1078; A61N 5/1081; H05H 13/04; H05H 1/24; H05H 1/46; H05H 7/08; H05H 7/10; H05H 2007/082; H05H 2007/085; H05H 2007/087; H05H 2007/088; H05H 2277/11; H05H 7/04
See application file for complete search history.

(56) References Cited

U.S. PATENT DOCUMENTS

| 2006/0198485 A1* | 9/2006 | Binderbauer | G21B 1/052 376/121 |
|---|---|---|---|
| 2006/0267503 A1* | 11/2006 | Bystriskii | G21B 1/052 315/111.21 |
| 2011/0313232 A1* | 12/2011 | Balakin | A61N 5/10 600/1 |

* cited by examiner

*Primary Examiner* — Monica C King
(74) *Attorney, Agent, or Firm* — Penilla IP, APC

(57) ABSTRACT

An apparatus for generating plasma, including a quadrupole antenna having a center region and an outer region and configured to be disposed over a dielectric window of a plasma chamber. The quadrupole antenna including a first coil defining a first SDA and a second coil defining a second SDA, the first coil being in a nested arrangement within the second coil. The nested arrangement places a turn of the first coil to be adjacent to a corresponding turn of the second coil as the first and second coils spiral from the center region to the outer region of the quadrupole antenna. Adjacent turns of each of the first and second coils are horizontally separated from one another by a distance when disposed over the dielectric window.

22 Claims, 16 Drawing Sheets

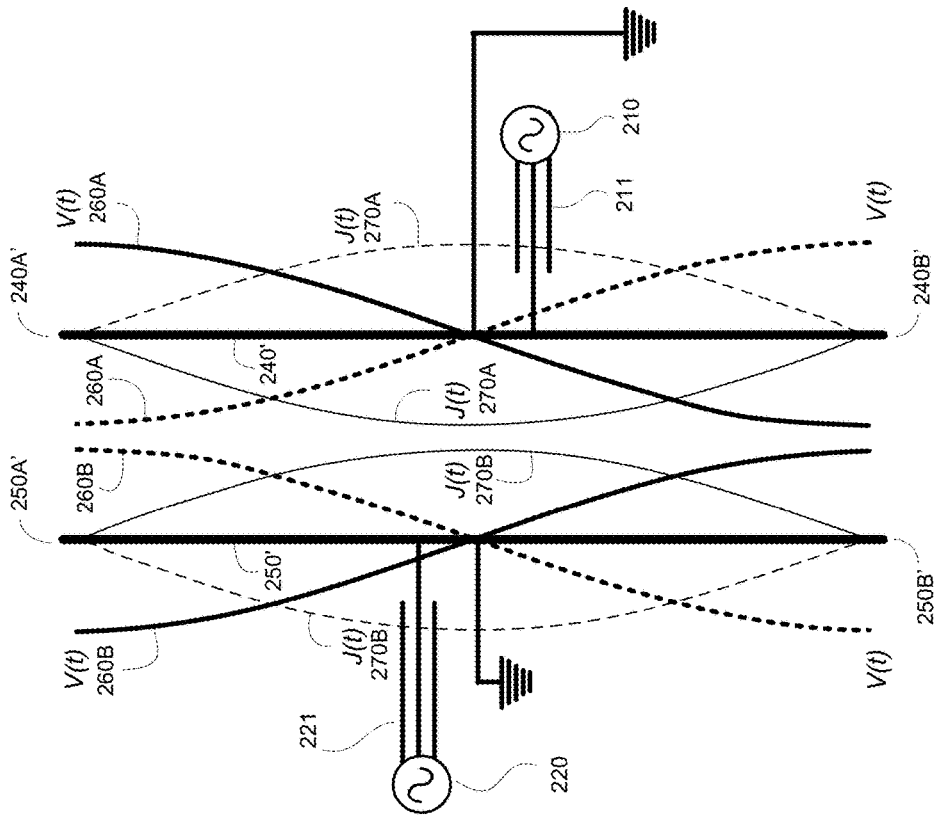
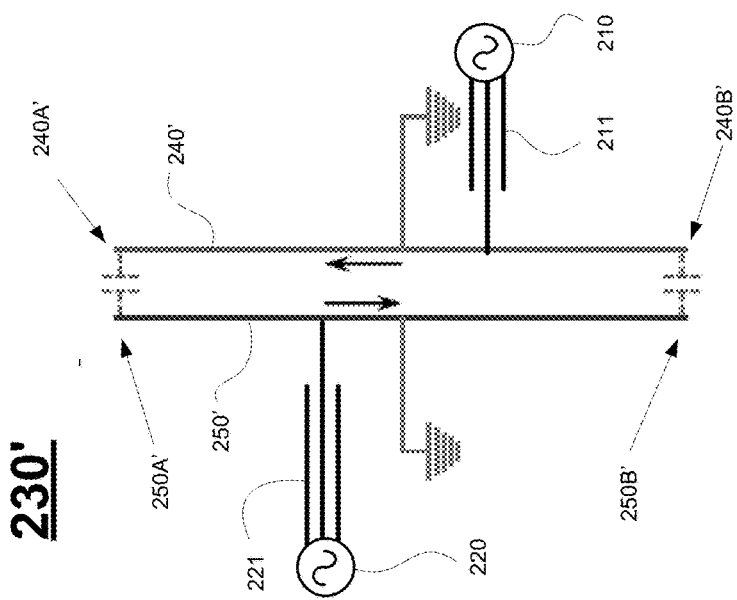
FIG. 2D
FIG. 2C

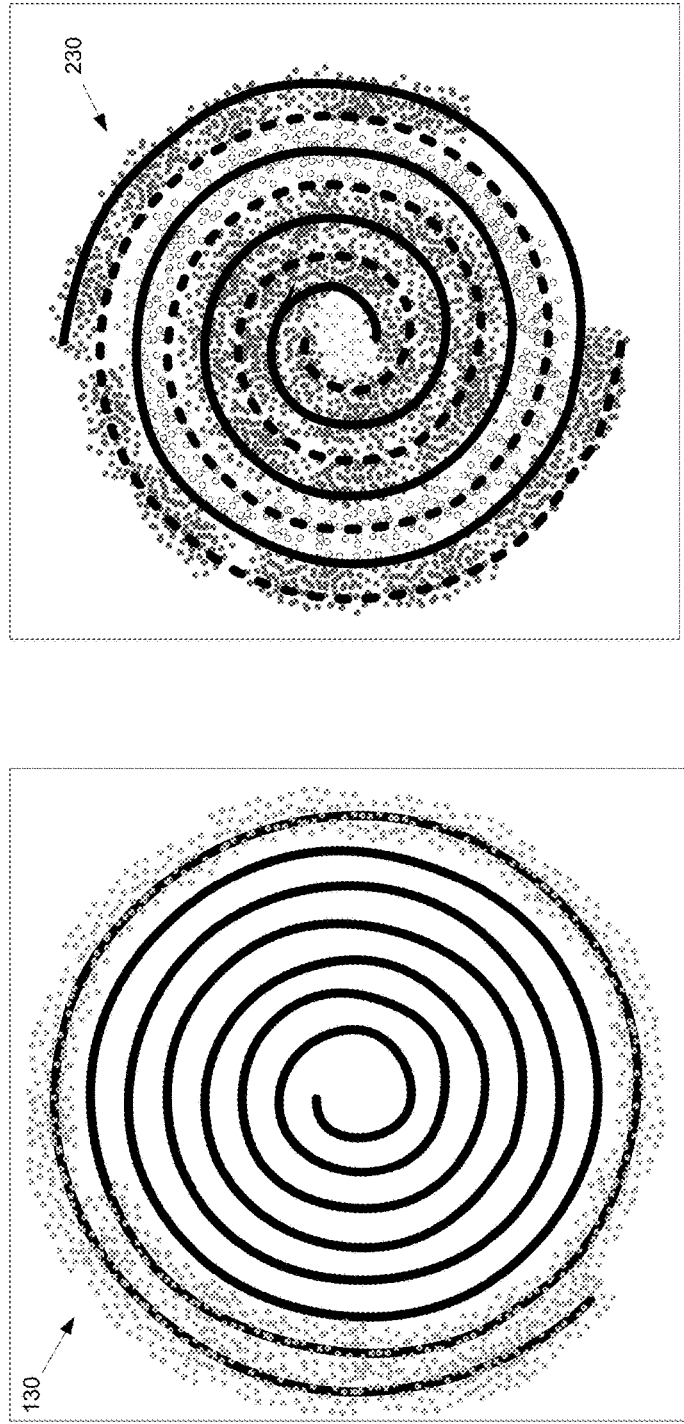

530B

530C

500C

**S-Field
SQA**

RF ANTENNA PRODUCING A UNIFORM NEAR-FIELD POYNTING VECTOR

TECHNICAL FIELD

The present embodiments relate to semiconductor substrate processing equipment, and more particularly, a uniform near-field Poynting vector antenna generating a plasma in a chamber.

BACKGROUND OF THE DISCLOSURE

Plasma generation is performed in semiconductor processing systems including those performing deposition and etching, (e.g., plasma enhanced deposition and etching). Traditional plasma generating systems include transformer coupled plasma (TCP) systems, which is also referred to as inductively coupled plasma (ICP) systems. In TCP/ICP systems, the plasma contains various types of radicals, as well as positive and negative ions. The chemical reactions of the various radicals, positive ions, and negative ions are used, for example, to etch features, surfaces, and materials of the substrate. During the etching process, for example, a chamber coil performs a function analogous to that of a primary coil in a transformer, while the plasma performs a function analogous to that of a secondary coil in the transformer. Plasma reaction and generation may not be uniform across the substrate. In particular, plasma may be generated in a ring region somewhere over the interior of the substrate. Taking a cross-section, the plasma generation across a radial of the substrate may be characterized with an "M" pattern, wherein the two peaks form the ring. As such, plasma generation is non-uniformly concentrated in a ring over the substrate, which results in non-uniform semiconductor processing across the width of the substrate.

In traditional RF ICP/TCP systems, the inductor coil has to be placed close to the plasma's dielectric window, which results in a strong capacitive voltage. For applications where the capacitive voltage is adverse, a Faraday shield design would have to be implemented, complicating the source and its operations.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure It is in this context that embodiments of the disclosure arise.

SUMMARY

The present embodiments relate to solving one or more problems found in the related art, and specifically to provide an radio frequency (RF) antenna generating a uniform near-field Poynting vector resulting in an RF surface wave exciting and ionizing one or more process gasses in chamber. Several inventive embodiments of the present disclosure are described below.

Embodiments of the present disclosure include an apparatus for generating plasma. The apparatus includes a quadrupole antenna configured to be disposed over a dielectric window of a plasma chamber. The quadrupole antenna includes a first coil defining a first SDA and a second coil defining a second SDA, the first coil being in a nested arrangement within the second coil. The nested arrangement places a turn of the first coil to be adjacent to a corresponding turn of the second coil as the first and second coils spiral from a center region of the quadrupole antenna to an outer region of the quadrupole antenna. Adjacent turns of each of the first and second coils are horizontally separated from one another by a distance when disposed over the dielectric window.

Embodiments of the present disclosure include an apparatus for generating plasma. The apparatus includes a quadrupole antenna configured to be disposed over a dielectric window of a plasma chamber by a separation, the quadrupole antenna including a first SDA and a second SDA. The first SDA and the second SDA are vertically separated by a distance, such that the first SDA is in a first plane and the second SDA is in a second plane that is parallel to the first plane.

Embodiments of the present disclosure include an apparatus for generating plasma. The apparatus includes a plasma chamber including a substrate support and having a dielectric window, the plasma chamber configure for processing a substrate disposed on the substrate support, wherein the dielectric window is oriented over the substrate support. The apparatus includes a process gas supply configured for introducing at least one process gas into the plasma chamber. The apparatus includes a quadrupole antenna configured to be disposed over the dielectric window by a separation, the quadrupole antenna including a first SDA nested within a second SDA in a plane. The first SDA includes a first plurality of interconnected coils, and the second SDA includes a second plurality of interconnected coils. The first plurality of interconnected coils is horizontally separated in the plane from corresponding coils of the second SDA by a distance. The apparatus includes a first radio frequency (RF) power source configured to provide a first RF signal at a frequency to the first SDA. The apparatus includes a second RF power source configured to provide a second RF signal at the frequency to the second SDA.

Embodiments of the present disclosure include an apparatus for generating plasma. The apparatus includes a plasma chamber including a substrate support and having a dielectric window, the plasma chamber configure for processing a substrate disposed on the substrate support, wherein the dielectric window is oriented over the substrate support. The apparatus includes a process gas supply configured for introducing at least one process gas into the plasma chamber. The apparatus includes a quadrupole antenna configured to be disposed over the dielectric window by a separation, the quadrupole antenna including a first SDA and a second SDA. The first and second SDAs are vertically separated by a distance, such that the first SDA is in a first plane and the second SDA is in a second plane that is parallel to the first plane. The apparatus includes a first RF power source configured to provide a first RF signal at a frequency to the first SDA. The apparatus includes a second RF power source configured to provide a second RF signal at the frequency to the second SDA.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings.

FIG. 2C illustrates a linear representation of the RF GQA antenna, in accordance with one embodiment of the present disclosure.

FIG. 2D illustrates the current and voltage responses for an RF GQA, in accordance with one embodiment of the present disclosure.

FIG. 3A illustrates an E (electric field) signature of an RF SDA, in accordance with one embodiment of the present disclosure.

FIG. 3B illustrates an E (electric field) signature of an RF GQA, in accordance with one embodiment of the present disclosure.

FIG. 5B-1 is an illustration of a stacked-dipole quadrupole antenna (SQA) that includes intertwined dipole spiral antennas that are stretched out, in accordance with one embodiment of the present disclosure.

FIG. 5B-2 is an illustration of a stacked-dipole quadrupole antenna (SQA) that includes two dipole spiral antennas that are stacked, wherein each dipole spiral antenna is in a concave-up configuration, in accordance with one embodiment of the present disclosure.

FIG. 5B-3 is an illustration of a stacked-dipole quadrupole antenna (SQA) that includes two dipole spiral antennas that are stacked, wherein each dipole spiral antenna is in a concave-down configuration, in accordance with one embodiment of the present disclosure.

DETAILED DESCRIPTION

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe a class of quadrupole antennas that radiates not only from the high-current portion (e.g., center) of the antenna, but also from around the low-current portion of the antenna (e.g., the ends corresponding to the high voltage portions). The quadrupole antenna includes two 180 degree out-of-phase dipole antennas (and in one embodiment having equal-power) that takes advantage of the high-voltage tips having strong E (electric fields) that will radiate by the displacement current term of the Maxwell-Ampere equation. As a result, the quadrupole antenna combines the real-current radiation with the displacement-current radiation, to generate a spatially uniform magnitude of Poynting Vector (e.g., through radiation by E-dot+I-dot). The plasma generating system has a wide operation parameter-window, high-density, uniformity and, is compact (in terms of plasma volume and gap) with minimum ion-erosion on the plasma-facing surfaces of the system (e.g., plasma chamber). Specifically, the system (e.g., plasma source) is powered by a "uniform Poynting vector RF antenna," disclosed in embodiments. The resulting plasma can be considered as a RF-SWP (surface wave plasma), since it is heated by the uniform Poynting vector near-field through RF surface wave generation. And because of the Poynting vector near-field surface wave, the antenna can be placed far from the plasma's dielectric window. As a result, there is essentially no capacitive coupling necessitating a Faraday shield, such that embodiments of the present disclosure do not require a Faraday shield.

With the above general understanding of the various embodiments, example details of the embodiments will now be described with reference to the various drawings. Similarly numbered elements and/or components in one or more figures are intended to generally have the same configuration and/or functionality. Further, figures may not be drawn to scale but are intended to illustrate and emphasize novel concepts. It will be apparent, that the present embodiments may be practiced without some or all of these specific details. In other instances, well-known process operations have not been described in detail in order not to unnecessarily obscure the present embodiments.

Figure 1A:
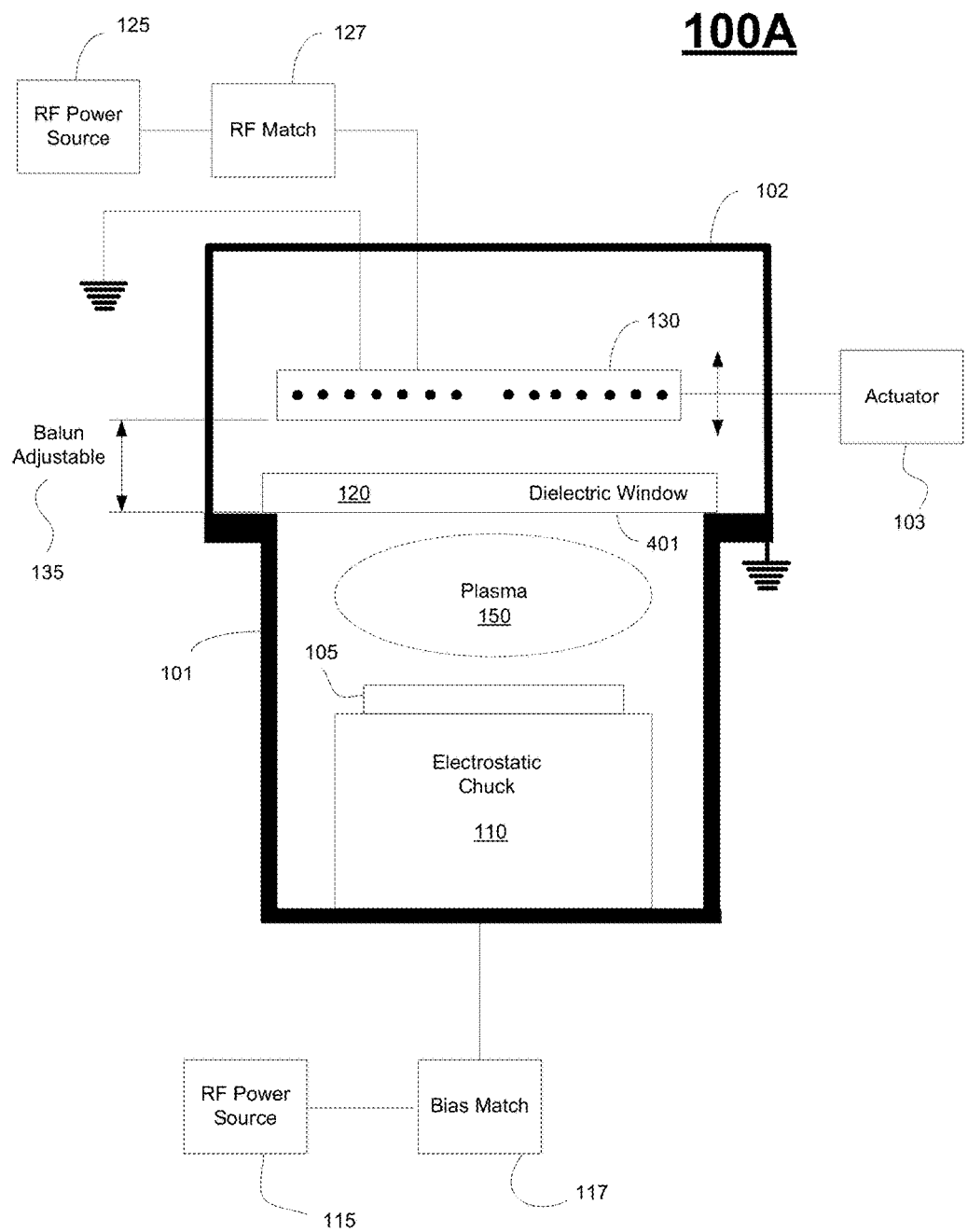
FIG. 1A illustrates an example of a plasma reactor system including a radio frequency (RF) spiral dipole antenna (SDA) configured for generating a near-field Poynting vector, in accordance with one embodiment of the present disclosure.

FIG. 1A illustrates an example of a plasma reactor system 100A including a radio frequency (RF) spiral dipole antenna (SDA) 130 configured for generating a near-field Poynting vector, in accordance with one embodiment of the present disclosure. Plasma reactor system 100A is configured for generating plasma 150 in chamber 101. For example, plasma reactor system 100A may be utilized for etching operations, in one embodiment. Plasma chamber 101 includes a chuck 110, a dielectric window 120, and the RF SDA 130. The chuck 110 can be an electrostatic chuck for supporting the substrate 105 (e.g., wafer) when present.

Further shown is a bias RF generator 115, which can be defined from one or more generators. If multiple generators are provided, different frequencies can be used to achieve various tuning characteristics. A bias match 117 is coupled between the RF generator(s) 115 and a conductive plate of the assembly that defines the chuck 110. The chuck 110 also includes electrostatic electrodes to enable the chucking and dechucking of the wafer. Broadly, a filter and a DC clamp power supply can be provided. Other control systems for lifting the substrate 105 off of the chuck 110 can also be provided. Although not shown, pumps are connected to the plasma chamber 101 to enable vacuum control and removal of gaseous byproducts from the plasma chamber during operational plasma processing.

The dielectric window 120 can be defined from a ceramic type material. Other dielectric materials are also possible, so long as they are capable of withstanding the conditions of a semiconductor etching chamber. Typically, plasma chambers operate at elevated temperatures ranging between about 50 Celsius and about 120 Celsius. The temperature will depend on the etching process operation and specific recipe. The plasma chamber 101 will also operate at vacuum conditions in the range of between about 1 m Torr (mT) and about 100 m Torr (mT).

Although not shown, plasma chamber 101 is typically coupled to facilities when installed in a clean room, or a fabrication facility. Facilities include plumbing that provide processing gases, vacuum, temperature control, and environmental particle control. These facilities are coupled to plasma chamber 101, when installed in the target fabrication facility. Additionally, plasma chamber 101 may be coupled to a transfer chamber that will enable robotics to transfer semiconductor wafers into and out of plasma chamber 101 using typical automation.

The RF SDA 130 is disposed over the dielectric window 120 and is connected to an optional RF matching circuit 127 and an RF power source (e.g., RF generator) 125. For example, the RF SDA 130 may operate from under 0.1-mtorr to above 100-torr. The antenna of the RF SDA 130 does not perform as an inductor coil of an RF TCP/IP system, such that the power-coupling intermediary is the magnetic field (H-field) of the planar spiral antenna. The plasma is sustained through RF surface-wave coupling (not inductive nor capacitive) via the near-field Poynting vector. For example, this RF SDA 130 can produce a 27.12 MHz SWP. The RF SDA 130 need not be placed close to the vacuum window 120. Because there is no capacitive coupling from the high voltage tips of the RF SDA 130, there is no need for a Faraday shield. The RF SDA 130 is further described in FIG. 1B below.

The RF SDA 130 is connected to an actuator 103 to provide vertical motion with respect to the dielectric window 120 (e.g., the plasma interface). In that manner, the impedance of the RF SDA 130 can be tuned to match the impedances between the RF SDA 130 and the coaxial cable feeding the RF power to the RF SDA 130. For example, the balun distance 135 is dynamically adjustable to match the balanced impedance of the RF SDA 130 to the unbalanced impedance of the coaxial cable (e.g., during operation). More particularly, the balun distance 135 is tuned or adjusted to dynamically adjust the imaginary component (i.e., phase adjustment and/or the reactance component) of the impedance of the RF SDA 130. That is, the balun distance 135 is dynamically tuned to perform frequency matching between the RF power source 125 and the RF SDA 130. The real component is adjusted through the location of the power connected to the RF SDA 130, as is shown in FIG. 1B.

The form factor of the RF SDA 130 can accommodate a large wavelength inside a small space. As such, the RF SDA 130 may be implemented within a smaller space of the upper housing 102 of the plasma reactor system 100A, especially with respect to the larger reactor systems typically required for TCP/IP reactor systems.

Figure 1B:
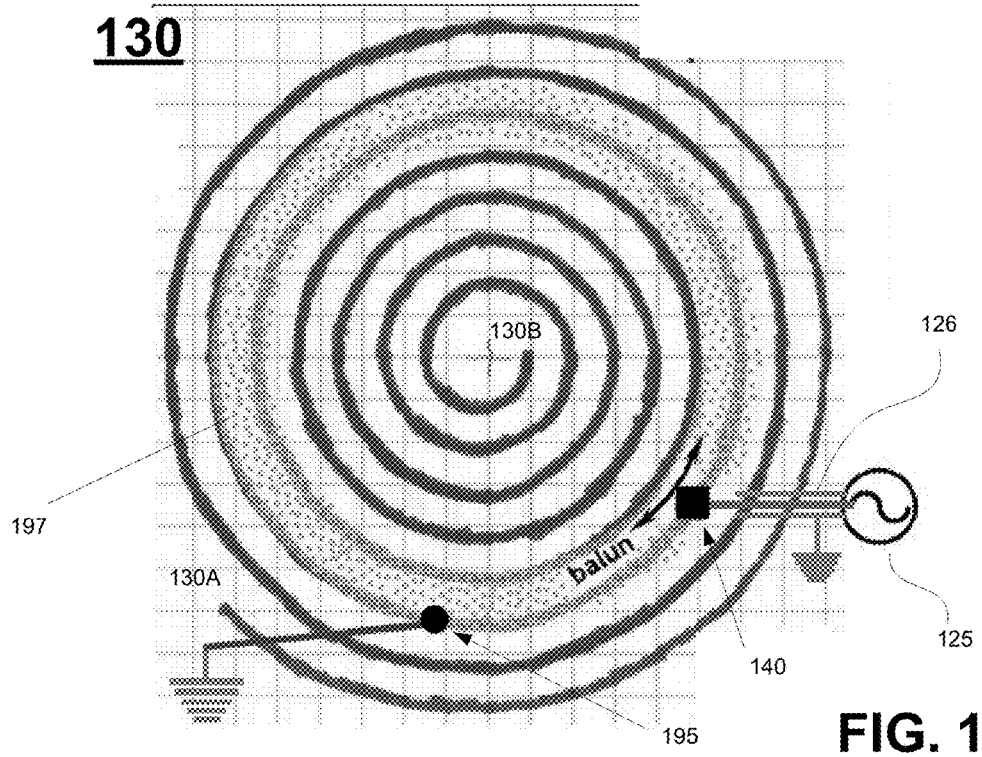
FIG. 1B illustrates an RF SDA, in accordance with one embodiment of the present disclosure.

FIG. 1B illustrates the RF SDA 130, in accordance with one embodiment of the present disclosure. As shown, the RF SDA 130 is configured as a planar spiral with two ends 130A and 130B. End 130B is located at the interior of the spiral, and end 130A is located at the exterior of the spiral. Ground is connected to the center 195 of the physical length of the RF SDA 130.

RF power from source 125 is connected to an adjustable (e.g., slidable) location 140 that is near-to-center. A strap from ground may be connected to the ground sheath of the coax cable 126, wherein ground is not connected to point 140. The selectable placement of the connection 140 for RF power performs magnitude matching between the RF power source 125 and the RF SDA 130. For example, the placement of location 140 (e.g., with respect to ground at center 195—balun adjustment) will adjust the impedance (e.g., adjust real component—R) between the RF power source 125 and the RF SDA 130. In particular, the balun adjustment (e.g., locating connection 140 on RF SDA 130) is dynamically tuned or adjusted (e.g., during operation) to adjust the real component of the impedance of the RF SDA 130. Placement of connection 140 is selectable for magnitude adjustment (e.g., of the impedance and/or inductance), such as equivalent to and/or providing a shunt element in a RF matching circuit (e.g., inductive (L) circuit). As such, the location of connection 140 affects the magnitude as seen by the RF SDA 130, and can be dynamically adjusted (e.g., during operation) by changing the placement of the location of connection 140 along the RF SDA 130.

However, for the RF SDA 130, its near-field pattern of the dipole radiation has a strong signature in the high-current ring region 197 near the center-region (e.g., physical) of the RF SDA 130. Further, its E (electric-field) shows up stronger near the outside loop because of the large ground-plane boundary. In particular, as the E×H near-field couples into the plasma (e.g., as a surface wave Poynting vector), it heats the plasma. That is, the surface wave heats the plasma preferentially in the high-current ring region 197, producing the usual M-shape $n_e(r)$, like what the single-coil TCP does. The M-shape $n_e(r)$ is shown in FIG. 1C, which illustrates the ionization rate $n_e$ of plasma with respect to radius $n_e(r)$ of a wafer when excited by an RF SDA 130, in accordance with one embodiment of the present disclosure. This M-shape characteristic is a major non-uniformity issue. In addition, the plasma density spatial profile for the spiral dipole antenna also resembles the ring-shape near-field radiation pattern.

Figure 1D:
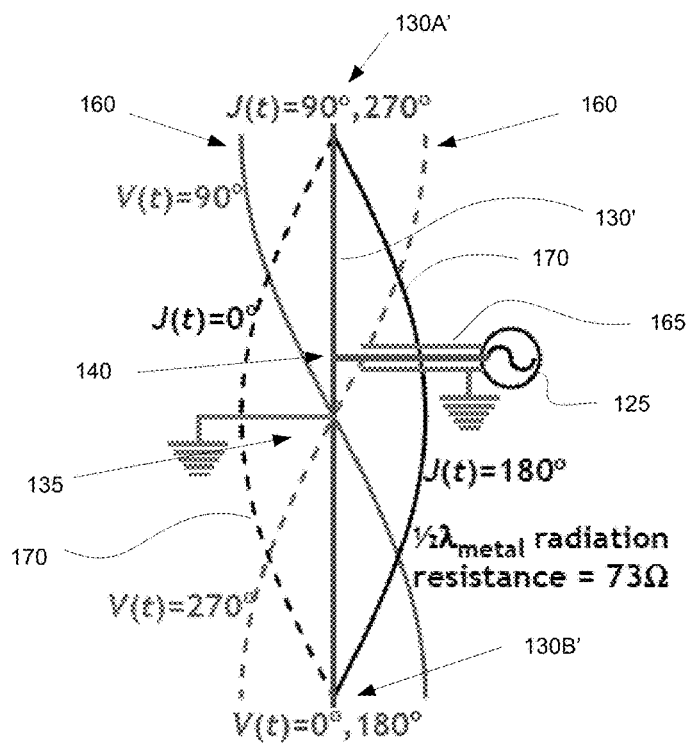
FIG. 1D illustrates the current and voltage response for an RF SDA, in accordance with one embodiment of the present disclosure.
Figure 1C:
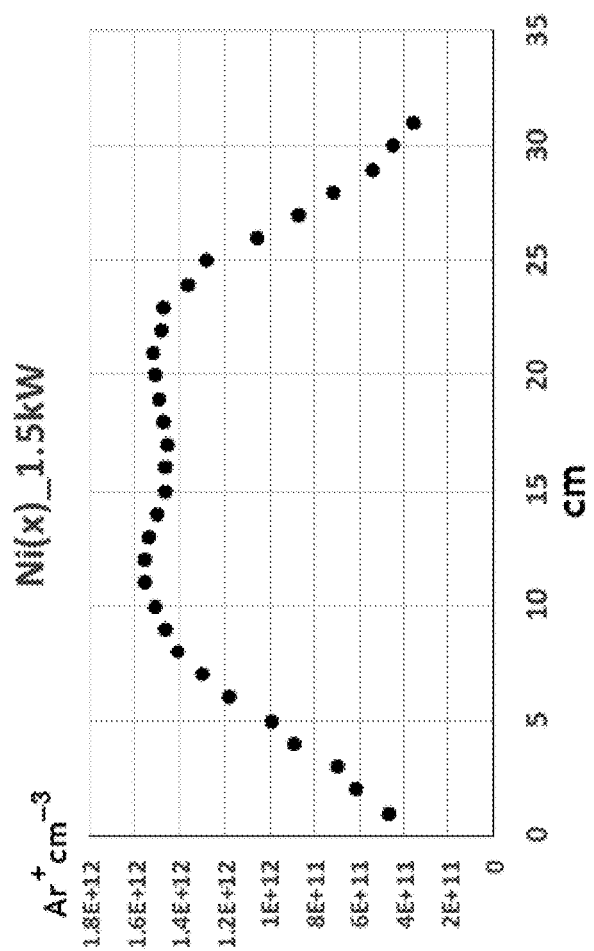
FIG. 1C illustrates the ionization rate $n_e$ of plasma with respect to radius $n_e(r)$ of a wafer when excited by an RF SDA, in accordance with one embodiment of the present disclosure.

FIG. 1D illustrates the current and voltage responses for an RF SDA 130', in accordance with one embodiment of the present disclosure. As shown, the RF SDA 130' is straightened, and referred to as straightened SDA 130', which has two ends 130A' and 130B'. Consistent with FIG. 1B, connection 140 is where RF power is supplied from the power source 125 to the RF SDA 130', and center 135 is connected to ground.

The voltage response 160—V(t) is shown to be oscillating. Voltage is highest near the ends 130A' and 130B' of the straightened SDA 130', and zero at the center 135. Also, the current response 170—J(t) is shown to be oscillating. Current is highest near the center 135 and zero at the ends 130A' and 130B' of the straightened SDA 130'. That is, as the straightened SDA 130' is radiating into free space, the antenna current is the highest at the center and tapers down towards the two ends 130A' and 130B' where the voltages become maximum. Since the two high voltage ends 130A' and 130B' are far to Earth, the E (electric fields) of the ends 130A' and 130B' are actually very weak. As a result, the antenna current induced H (magnetic field) starts the radiation. This produces the dipole radiation pattern, as previously described (e.g., a ring shape near-field radiation pattern).

Figure 2A:
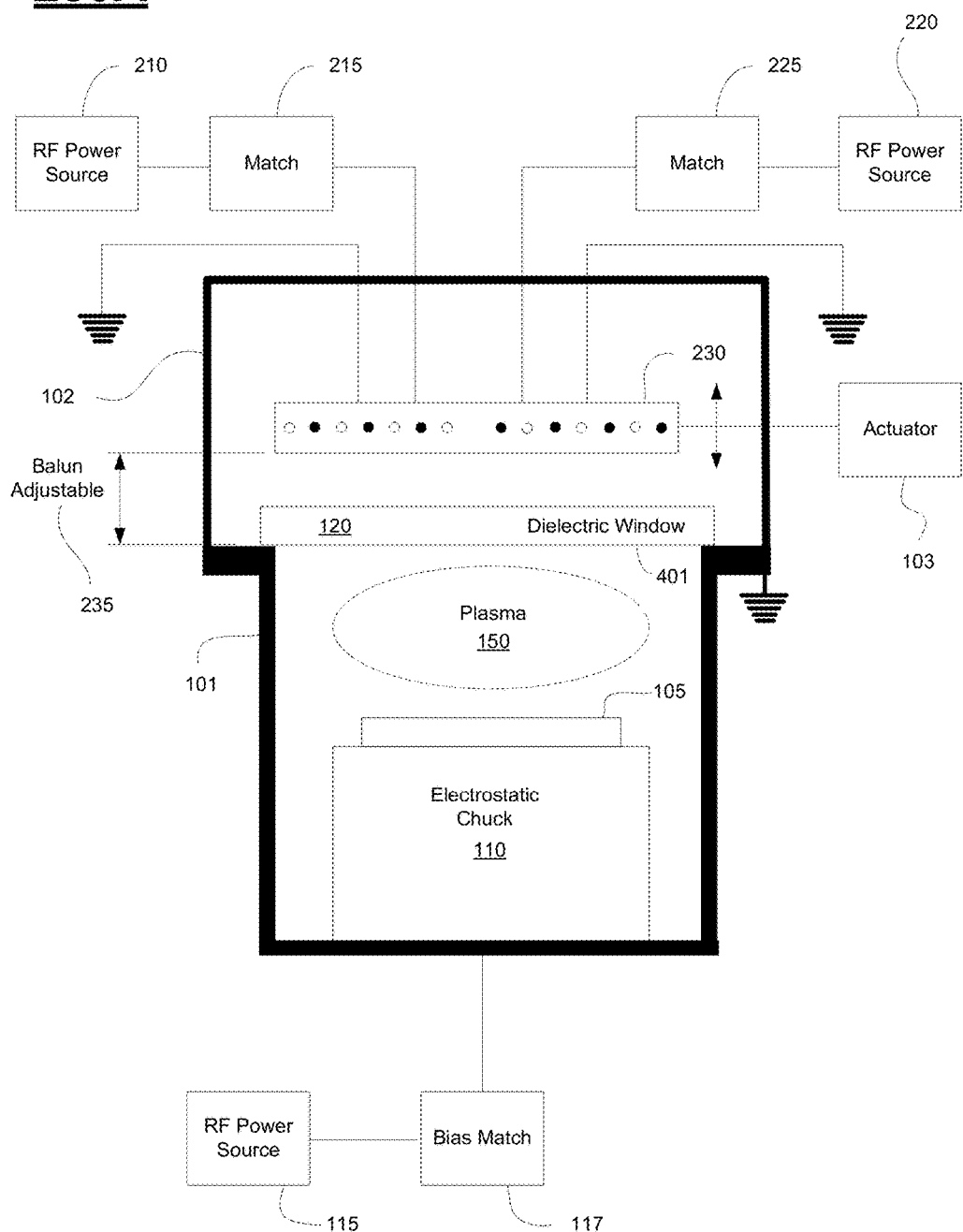
FIG. 2A illustrates an example of a plasma reactor system including an RF galaxy quadrupole antenna (GQA) having two SDAs intertwined in the same plane that is configured for generating a uniform near-field Poynting vector, in accordance with one embodiment of the present disclosure.

FIG. 2A illustrates an example of a plasma reactor system 200A including an RF galaxy quadrupole antenna (GQA) having two SDAs intertwined in the same plane that is configured for generating a uniform near-field Poynting vector, in accordance with one embodiment of the present disclosure. Plasma reactor system 200A is configured for generating plasma 150 in plasma chamber 101. Generally, plasma reactor system 200A may be similarly configured as the plasma reactor system 100A of FIG. 1A but including a different antenna system to the RF galaxy quadrupole antenna 230. For example, plasma reactor system 200A may be utilized for etching operations and other processing operations, in embodiments.

The system 200A including plasma chamber 101 is configured for processing a substrate 105 disposed on a substrate support 110, such as an electrostatic chuck 110 that is configured for supporting a substrate 105. The chuck 110 includes electrostatic electrodes to enable the chucking and dechucking of the substrate 105. For example, the substrate may be a wafer placed into the plasma chamber for processing. During processing, a process gas supply (not shown) is configured for introducing at least one process gas into the plasma chamber. Although not shown, pumps are connected to plasma chamber 101 to enable vacuum control and removal of gaseous byproducts from plasma chamber 101 during operational plasma processing. Plasma chamber 101 may be coupled to facilities when installed in a clean room, or a fabrication facility, including plumbing to provide processing gasses, vacuum, temperature control, and environmental particle control. Plasma chamber 101 may operate at elevated temperatures (e.g., between 50-120 Celsius) depending on the process operations and specific recipe of gases. Plasma chamber 101 may be configured as a vacuum chamber, and operate at vacuum conditions ranging between 1 mm Torr (mT) and about and above 100 m Torr (mT).

As previously described, system 200A includes a bias RF generator 115 defined as one or more generators operating at one or more frequencies. Bias match 117 is coupled between RF generator(s) 115 and a conductive plate that defines the chuck 110. Other control systems (not shown) for lifting the substrate 105 off the chuck can also be provided. Further, plasma chamber 101 includes a dielectric window 120 that is oriented over the substrate support. The dielectric window 120 can be defined from a ceramic type material.

System 200A includes a quadrupole antenna 230 disposed over the dielectric window 120, the quadrupole antenna 230 including a first spiral dipole antenna (SDA) 240 and a second SDA 250, as further described in FIG. 2B below. The quadrupole antenna 230 may be contained within an upper housing 102 that is positioned above the plasma chamber 101. Each of the first and second SDAs 240, 250 is coupled to a respective RF matching circuit (optional) and RF power source. For example, the first SDA 240 may be coupled to optional RF matching circuit 215 and RF power source (e.g., RF generator) 210 configured to provide a first RF signal at a frequency to the first SDA 240. In addition, the second SDA 250 may be coupled to optional RF matching circuit 225 and RF power source 220 configured for providing a second RF signal at the same frequency to the second SDA 250, in one embodiment. In other embodiments, different frequencies power the individual SDAs of the quadrupole antenna 230. For example, an SDA may operate at a frequency selected between 400 kilohertz (kHz) and 300 megahertz (MHz).

The quadrupole antenna 230 is disposed at a separation 235 from window 120 (e.g., the plasma interface). The dielectric window 120 is configured as an interface between the upper housing 102 and the plasma chamber 101. In particular, actuator 103 is connected to the RF quadrupole antenna 230 (e.g., electrically in series) to provide vertical motion with respect to the dielectric window 120, such that the z-direction location of the antenna-set (e.g., quadrupole antenna 230) is tuned relative to the ground plane, which is parallel to the window 120. By varying the separation 235 (e.g., balun adjustment), the impedance of the RF quadrupole antenna 230 can be dynamically tuned (e.g., during operation) to match the impedance of RF power delivery system delivering power to the quadrupole antenna 230. In particular, actuator 103 is coupled to the quadrupole antenna 230 and is configured to adjust the separation 235 to perform impedance matching between the first RF power supply 210 and the first SDA 240 and the second RF power supply 220 and the second SDA 250. For example, the balun separation 235 is tuned to match the balanced impedance of the quadrupole antenna 230 to the unbalanced impedance of the one or more coaxial cables delivering power. More particularly, the balun (balanced/unbalanced) distance is tuned or adjusted to dynamically adjust the imaginary component (i.e., phase adjustment and/or the reactance component) (e.g., perform frequency matching) of the impedance of the quadrupole antenna 230. In embodiments, the separation 235 is within a range between 0.1 to 4.0 meters. In other embodiments, the separation 235 is within a range between 0.4 to 3.0 meters. In still other embodiments, the separation 235 is within a range between 0.1 to 2.0 meters. In other embodiments, the separation 235 is within a range between 0.4 to 1.0 meters. The real component can be adjusted through the one or more locations of the one or more power connections on the RF quadrupole antenna 230.

The quadrupole antenna 230 produces an electromagnetic field passing through the window 120 as a surface wave along a plasma-window interface 401, the surface wave exciting and ionizing the at least one process gas to generate plasma within the chamber. That is, the quadrupole antenna 230 does not perform as an inductor coil of an RF TCP/IP system. Instead, the power-coupling intermediary is the magnetic field (H-field) of the quadrupole antenna 230. The plasma is sustained through RF surface-wave coupling (not inductive nor capacitive). For example, this quadrupole antenna 230 can produce a 27.12 MHz surface wave plasma (SWP). In particular, the intermediary for an RF SWP (e.g., operating at 27 MHz) is the near-field Poynting vector, and as a result the quadrupole antenna 230 need not be placed close to the window 120. This alleviates the capacitive coupling from the high voltage tips. That is, the plane of the quadrupole antenna 230 can be quite far above the plane of the plasma-window interface 401 (e.g., separation 235). In addition, because there is no capacitive coupling from the high voltage tips of the quadrupole antenna 230, there is no need for a Faraday shield. The quadrupole antenna 230 is further described in FIG. 2B, below.

The form factor of the quadrupole antenna 230 can accommodate a large wavelength inside a small space. As such, the antenna 230 can be implemented within a smaller space of the upper housing 102 of the plasma reactor system 200A, especially with respect to the larger reactors systems typically required for TCP/IP reactor systems.

Figure 2B:
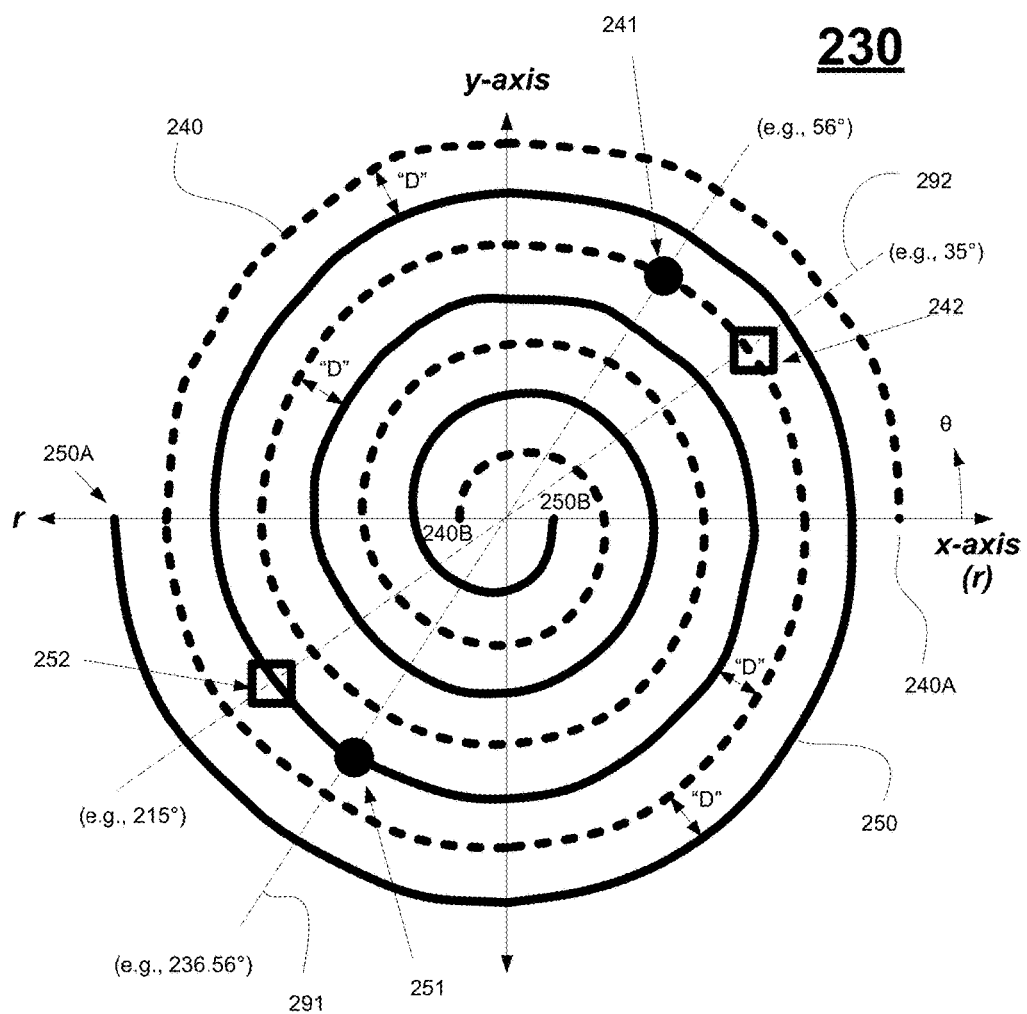
FIG. 2B illustrates an RF GQA, in accordance with one embodiment of the present disclosure.

FIG. 2B illustrates the quadrupole antenna 230 of FIG. 2A, in accordance with one embodiment of the present disclosure. The quadrupole antenna 230 includes two dipole antennas on the same plane (e.g., defined by the x-axis/y-axis coordinate plane or r, 0 coordinate plane). Each of the dipole antennas is in a spiral or galaxy configuration (or combined to be in a galaxy configuration), and as such the quadrupole antenna 230 is also referred to as the RF Galaxy Quadrupole Antenna (GQA) 230. In particular, the GQA 230 includes a first SDA 240 and a second SDA 250 that are located on the same plane. In one embodiment, the directions (e.g., clock or counter-clock) of spirals in SDAs 240 and 250 are identical. In another embodiment, the directions (e.g., clock or counter-clock) are opposite, with corresponding adjustments to phase for the SDAs 240 and 250 and/or other parameters for achieving appropriate E (electric fields) at the ends of the SDAs (e.g., see FIG. 2C). GQA 230 is configured to provide radiation at the high current regions (e.g., center) and at the tips (e.g., high voltage regions), consistent with FIG. 2C.

The first SDA 240 is nested within the second SDA 250. In particular, a first coil defines the first SDA 240, wherein the first coil includes one or more turns. A second coil defines the second SDA 250, wherein the second coil includes one or more turns. The first coil is in a nested arrangement within the second coil. That is, the nested arrangement places a turn of the first coil to be adjacent to a corresponding turn of the second coil as the first and second coils spiral from a center region of the GQA 230 to an outer region of the GQA 230. In addition, adjacent turns of each of the first and second coils are horizontally separated from one another by a distance when disposed over the dielectric window 120. In the nested arrangement in one embodiment, the first SDA 240 (shown as a dotted line) includes an end 240A located at the exterior or outer region of the SDA 240, and an end 240B that is located at the interior of SDA 240. The second SDA 250 (shown as a solid line) includes an end 250B located at the interior of the SDA 250, and an end 250A that is located at the exterior or outer region of the SDA 250. The ends 240B and 250B define and/or are contained within a center region of the GQA 230.

In one embodiment, each of the first SDA 240 and the second SDA 250 is of a continuous length. For example, first SDA 240 is continuous from end-to-end and has a first length. Also, the second SDA 250 is continuous from end-to-end and has a second length. In one embodiment, each of the first SDA 240 and the second SDA 250 has a length approximately equal to half the wavelength corresponding to the frequency of the first RF signal (e.g., from RF power source 210) and the second RF signal (e.g., from RF power source 220). That is, for whatever RF frequency chosen, the length of each of the corresponding dipole antenna is half the corresponding wavelength (hence, dipole). For example, for a frequency of 60 MHz, the length is approximately half the corresponding wavelength ($\lambda$) for each of SDA 240 and SDA 250, wherein the wavelength may vary according to one or more parameters (e.g., antenna material composition or properties, ambient conditions (e.g., temperature, moisture, etc.), etc.).

Ground is coupled to the first SDA 240 at connection 241, and RF power (e.g., from power source 210) is coupled to first SDA 240 at connection 242. Ground is coupled to the second SDA 250 at connection 251, and RF power (e.g., from power source 220) is coupled to the second SDA 250 at connection 252. Ground connections 241 and 251 are located at the physical centers of respective SDAs (e.g., connection 241 is the center of the first length of the first SDA 240, and connection 251 is the center of the second length of the second SDA 250). For example, the connections 241 and 251 are tied to Earth (through some copper—Cu-wire, that has some large inductive impedance). This provides that the physical center of the GQA 230 may be the maximum current point and correspondingly the minimum voltage point.

In one implementation, coaxial power-out lines from the RF power sources are connected to sliding-feed points near the center points (e.g., at connections 241 and 251) of respective SDAs 240 and 250. For example, slidable connection 242 is a sliding-feed point coupling RF power source 210 to the SDA 240, wherein the sliding-feed point provides a tuning mechanism (e.g., dynamic tuning during operation) for matching impedances of the SDA 240 and the corresponding power source system. For example, tuning may be performed for matching impedances of the SDA 240 and the RF power source 210 and/or to the coaxial cable 211 feeding power from the source 210 (e.g., at 60 MHz). That is, the RF signal from the RF power source 210 is fed to SDA 240 at a near distance (at connection 242) from the center connection 241 to ground, wherein the near distance can be dynamically tuned for impedance matching (e.g., matching the line feeding the RF signal and the antenna 240) (e.g., adjust the real component—R—for purposes of impedance matching and/or magnitude adjustment, such as when providing a shunt element in a RF matching circuit). Also, slidable connection 252 is a sliding-feed point coupling RF power source 220 to the SDA 250, wherein the sliding-feed point provides a tuning mechanism for matching impedances of the SDA 250 and the corresponding power source system. For example, tuning may be performed for matching impedances of the SDA 250 and the RF power source 220 and/or to the coaxial cable 221 feeding power from the source 220. That is, the RF signal from the RF power source 220 is fed to SDA 250 at a near distance (at connection 252) from the center connection 251 to ground, wherein the near distance can be dynamically tuned for impedance matching (e.g., matching the line feeding the RF signal and the SDA 250) (e.g., adjust the real component—R—for purposes of impedance matching and/or magnitude adjustment, such as when providing a shunt element in a RF matching circuit). As such, tuning may be performed through sliding of the power connections along respective SDAs 240, 250. Also, the other tune-knob configuration is the selection of the z-direction location of the antenna-set relative to the ground plane, as previously described.

Purely for illustration, an example of the GQA 230 operating at 60 MHz is provided. As shown in FIG. 2B, the lengths of each of the SDAs 240 and 250 is half the corresponding wavelength (e.g., 98.42 inches). As a continuation of the example, for the first SDA 240, the center point 241 is 5.686 inches, 56.56° (r,θ), exterior end point 240A is 7.978 inches, 3.87° (r,θ), and interior (e.g., start) end point is 1 inch, 180° (r,θ). As a continuation of the example, for the second SDA 250, the center point 251 is 5.686 inches, 236.56° (r,θ), exterior end point 250A is 7.978 inches, 183.87° (r,θ), and interior (e.g., start) end point is 1 inch, 0° (r, θ). Other dimensions and frequencies are supported in other embodiments.

As shown in FIG. 2B, SDAs 240 and 250 are spatial-temporal orthogonal dipole antennas. For example, the centers 241 and 251 are 180 degrees apart, wherein center 241 of SDA 240 is at 56.56° and center 251 of SDA 250 is at 236.56°. Also, at the same frequency, the power connections are approximately 180 degrees apart, wherein connection 242 of SDA 240 is at 35° and connection 252 of SDA 250 is at 215°.

In one embodiment, in the GQA 230, the first SDA 240 is displaced from the second SDA 250 by a distance. In one embodiment, the displacement is a lateral or horizontal displacement in a plane. In another embodiment, the displacement may be a vertical displacement, as is further described below. With a lateral displacement, as is shown in FIG. 2B, the first SDA 240 is in a nested arrangement within the second SDA 250 in a plane. As previously described, a first coil (one or more turns) defines the first SDA 240, and a second coil (one or more turns) defines the second SDA 250. The nested arrangement between the first and second coils places a turn of the first coil to be adjacent to a corresponding turn of the second coil as the first and second coils spiral from the center region of the GQA 230. Also, adjacent turns of each of the first and second coils are horizontally displaced from one another by a distance "D" when disposed over the dielectric window 120. FIG. 2B shows several displacement regions as illustrations. Purely for illustration, the distance "D" may be 1 inch, but may be of any dimension and variable depending on numerical optimization.

FIGS. 2C-2D provide linear representations of the GQA 230 to better illustrate current and voltage characteristics for GQA 230 (e.g., non-linear spiral or galaxy configuration), in accordance with embodiments of the present disclosure. In particular, FIG. 2C illustrates a linear representation of the GQA 230, wherein the GQA 230 is stretched out (e.g., unspiraled or straightened). As such, the first dipole antenna 240' corresponds to the first SDA 240, and is connected to ground at the center point, and connected to RF power source 210 at a near-center point through coaxial feed 211, as previously described. Placement of power source 210 on the first dipole antenna 240' (e.g., balun adjustment between grounded center and connection of power source 210) is selectable for magnitude adjustment (e.g., of the impedance and/or inductance), such as providing a shunt element in an inductive (L) circuit. In addition, the second dipole antenna 250' corresponds to the second SDA 250, and is connected to ground at the center point, and connected to RF power source 220 at a near-center point though coaxial feed 221, as previously described. Placement of power source 220 on the second dipole antenna 250' (e.g., balun adjustment between grounded center and connection of power source 220) is selectable for magnitude adjustment (e.g., of the impedance and/or inductance), such as providing a shunt element in an inductive (L) circuit. Characteristics of the linear representations of the dipole antennas combined are representative of the characteristics for the GQA 230, as is described below.

The configuration of the first dipole antenna 240' in relation to the second dipole antenna 250' generates one or more stray capacitances. In particular, stray capacitances are generated between the ends of the two antennas. For example, stray capacitance 271 is generated between end 240A' (antenna 240') and end 250A' (antenna 250'). Also, stray capacitance 272 is generated between end 240B' (antenna 240') and end 250B' (antenna 250').

FIG. 2D illustrates the current and voltage responses for the linear representation of the GQA 230, in accordance with one embodiment of the present disclosure. In one embodiment, the two spiral or galaxy dipole antennas 240 and 250 run 180-degrees out-of-phase (e.g., the two RF power sources 210 and 220 or generators are 180-degrees out, with the same power output levels). Correspondingly, the two dipole antennas 240' and 250' also run 180-degrees out-of-phase.

For each dipole antenna 240' and 250' radiating into the free space, the antenna current (e.g., real current J) is the highest at the center and tapers down towards the ends where the voltages become maximum. For example, for dipole antenna 240', the maximum values (oscillating between positive and negative values) of the real current response J(t) 270A occurs at the center of the dipole antenna 240'. The minimum values (e.g., zero) of the real current response J(t) 270A occurs at the ends 240A' and 240B'. The oscillation for the real current response J(t) 270A is shown by the dotted and solid lines. Also, at the center of dipole antenna 240', the voltage response V(t) 260A oscillates back and forth at zero. The maximum values (oscillating between positive and negative values) occurs at the ends 240A' and 240B'. The oscillation for the voltage response V(t) 260A is also shown by dotted and solid lines.

Similarly, for dipole antenna 250', the maximum values (oscillating between positive and negative values) of the real current response J(t) 270B occurs at the center of the dipole antenna 250', and the minimum values (e.g., zero) occurs at the ends 250A' and 250B'. The oscillation for the real current response J(t) 270B is shown by the dotted and solid lines. Also, at the center of dipole antenna 250', the voltage response V(t) 260B oscillates back and forth at zero. The maximum values (oscillating between positive and negative values) occurs at the ends 250A' and 250B'. The oscillation for the voltage response V(t) 260B is also shown by dotted and solid lines.

In each of the dipole antennas 240' and 250', corresponding ends are far to Earth, and as such, the E (electric fields) for the corresponding ends of each of dipole antennas 240' and 250' are actually very weak. As such, it is the antenna current induced H (magnetic field generated by current) that starts the radiation and hence, producing the usual dipole radiation pattern for each of dipole antennas 240' and 250'.

In one embodiment, the two dipole antennas 240' and 250' have opposite currents (e.g., a "Counter Current Array" configuration). That is, the first RF power source 210 feeding the first dipole antenna 240' a first RF signal and the second RF power source 220 feeding the second dipole antenna 250' a second RF signal are out-of-phase. In one embodiment, the respective RF signals are 180 degrees out-of-phase. In other embodiments, the respective RF signals are out-of-phase between 0-180 degrees). In particular, at 180 degrees out-of-phase, the current and voltage responses for dipole antennas 240' and 250 are mirrored. For example, at ends 240A' and 250A' the voltage responses V(t) 260A and 260B are equal but of opposing signs (e.g., positive and negative). The effect of current and voltage throughout the dipole antennas 240' and 250' (at corresponding points) is not a canceling effect (e.g., cumulative or supportive).

Correspondingly, the GQA 230 is configured as a counter current array, such that the first RF signal from RF power source 210 resonates a first RF current in the first SDA 240, and the second RF signal from RF power source 220 resonates a second RF current in the second SDA 250 that is counter to the first RF current. The combined current responses for the first SDA 240 and the second SDA 250 will result in a somewhat localized H magnetic field) under the high current portion of the SDAs (e.g., the centers 241 and 251), and as a result, the two SDAs 240 and 250 together acts like a quadrupole antenna. That is, the two SDAs 240 and 250 are spatially and temporally orthogonal. For example, the current dipole is tangential and the displacement current dipole is radial, such that their strengths are 90° directionally apart. The combined spiral shapes of SDAs 240 and 250 is similar to that of a galaxy of stars, hence the nomenclature galaxy quadrupole antenna (GQA) 230.

In other embodiments, the two spiral or galaxy dipole antennas of GQA 230 could run at any values of phase (e.g., other than 180 degrees), and at any values of power levels (e.g., other than being the same power). Furthermore, the phase does not have to be at a fixed value over a period of time, in embodiments. For example, the phase between the two spiral or galaxy dipole antennas of GQA 230 could oscillate sinusoidally within a value-range for better Poynting vector uniformity, in one embodiment. In other embodiments, power does not have to be at a fixed value over a period of time. That is, one or more of the two supplied powers could oscillate sinusoidally within a value-range for a better Poynting vector uniformity. For example, there may be inherent line-mismatch that increases from the center to the galaxy-arm ends for the GQA 230 that causes a slight non-uniformity. In embodiments, such non-uniformity could be fixed with oscillating phase and/or oscillating power(s).

Normally in a single dipole antenna, the real current at the ends is zero because of the correspondingly weak E (electric fields). However, because the GQA 230 has two dipole antennas with two pairs of corresponding ends, a displacement current is generated from the Maxwell-Ampere Equation. As such, the source of the radiation of the GQA 230 includes the usual Real Current radiation from the high-current region (e.g., centers of the SDAs 240 and 250), as well as the two pairs of corresponding ends of the SDAs 240 and 250). In particular, around the low-current portion of the SDAs (i.e., the ends corresponding to the high-voltage parts that are 180 degrees out-of-phase between the two SDAs 240 and 250), E (electric fields) between the two SDAs 240 and 250 will radiate by the displacement current term of the Maxwell-Ampere Equation 1. In Equation 1, the first term illustrates the source of the real current, wherein the displacement current is the second term including the change in E (electric field) over time. Equation 2 is another form of the Maxwell-Ampere Equation.

$$\nabla \times B = \mu_0 J + \frac{1}{c^2} \frac{\partial E}{\partial t} \quad (1)$$

$$\oint B \cdot dl = \mu_0 \int \int J \cdot dS + \frac{1}{c^2} \frac{d}{dt} \int \int E \cdot dS \quad (2)$$

FIGS. 3A-3B provide E (electric field) signatures for the spiral dipole antenna (SDA) 130 and the galaxy quadrupole dipole antenna (GQA) 230 for comparison purposes. In particular, FIG. 3A illustrates an E (electric field) signature 300A of the RF SDA 130, in accordance with one embodiment of the present disclosure. In signature 300A, the E (electric field) shows up a little bit concentrated near the outside loop of the RF SDA 130, in part because of the large ground-plane boundary (Earth), and because there is no displacement current contribution. FIG. 3B illustrates an E (electric field) signature of a GQA 230, in accordance with one embodiment of the present disclosure. In signature 300B, the E (electric field) is more uniform and more concentrated throughout the footprint of the GQA 230, in part between there is a displacement current contribution at the pairs of ends of the two SDAs 240 and 250. In particular, the strength of the E (electric field) is maintained across the GQA 230, such that uniformly strong E (electric fields) appear at or near both (low-current) ends without regard to the ground-plane boundary. In particular, at exterior ends 240A and 250A of the SDAs 240 and 250, and in the exterior perimeter of GQA 230 (e.g., outside loops), the E (electric field) is strong (as filled by gray dots). Similarly, at the interior ends 240B and 250B of the SDAs 240 and 250, and in the interior of GQA 230, the E (electric field) is equally strong. Also, the E (electric field) is uniformly strong through the middle of GQA 230 (e.g., highly concentrated and uniform between the interior and exterior ends), but may be weaker than the other regions (as filled by open circles). As such, the E (electric field) signature 300B of the GQA 230 is more uniform throughout the entire antenna in comparison to the concentration of the E (electric field) signature 300A in the outer loops of SDA 130.

Figure 3D:
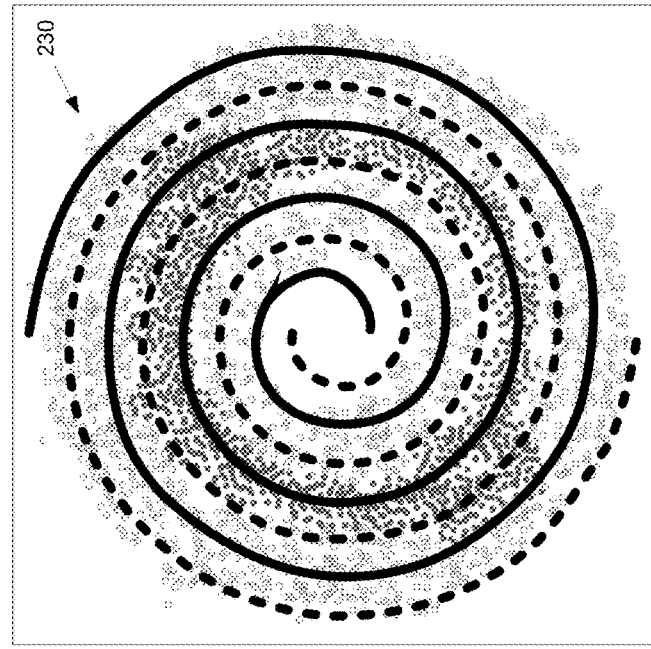
FIG. 3D illustrates an H (magnetic field signature of an RF GQA, in accordance with one embodiment of the present disclosure.
Figure 3C:
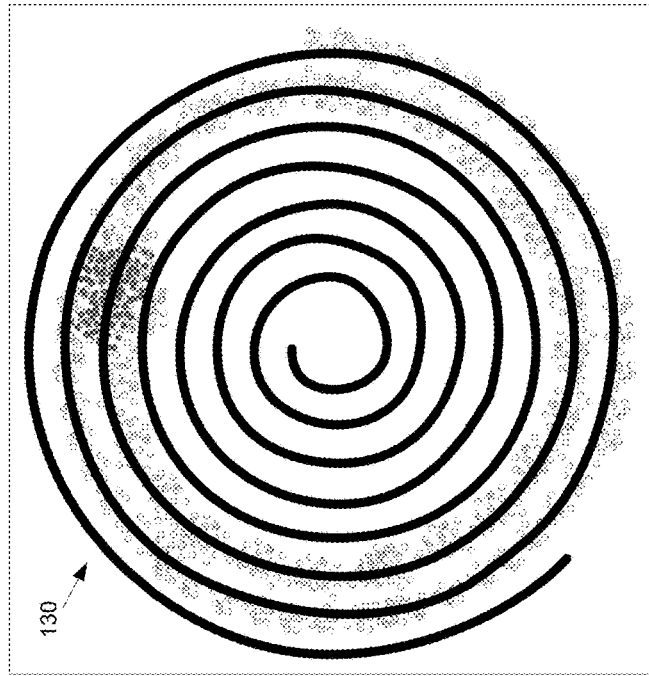
FIG. 3C illustrates an H (magnetic field) signature of an RF SDA, in accordance with one embodiment of the present disclosure.

FIGS. 3C-3D provide H (magnetic field) signatures for the RF SDA 130 and the GQA 230 for comparison purposes. In particular, FIG. 3C illustrates an H (magnetic field) signature 300C of an RF SDA 130, in accordance with one embodiment of the present disclosure. Because the H (magnetic field) is formed through current flow (perpendicular to the direction of the current flow or motion), the H (magnetic field) signature of an antenna closely follows the E (electric field) signature of the antenna. For example, for the RF SDA 130, the H (magnetic field) signature 300C is similar to the E (electric field) signature 300A, such that the H (magnetic field) is concentrated at or near the outer loops of SDA 130. Similarly, for the GQA 230, the uniformity of the H (magnetic field) signature 300D is similar to the uniformity of the E (electric field) signature 300B (e.g., uniformly concentrated E (electric fields) appear near both low-current and high-voltage ends, and between the ends such as near the high E (electric field) center). In particular, the H (magnetic field) signature 300D is more uniform due to localized-H (e.g., at any point in the GQA 230) resulting from the "Counter Current Array" of this quadrupole antenna. As shown, the H (magnetic field) may be strongest in the center of the GQA 230 (as filled by the gray dots), and weaker in the other regions (as filled by the open circles).

Figure 4A:
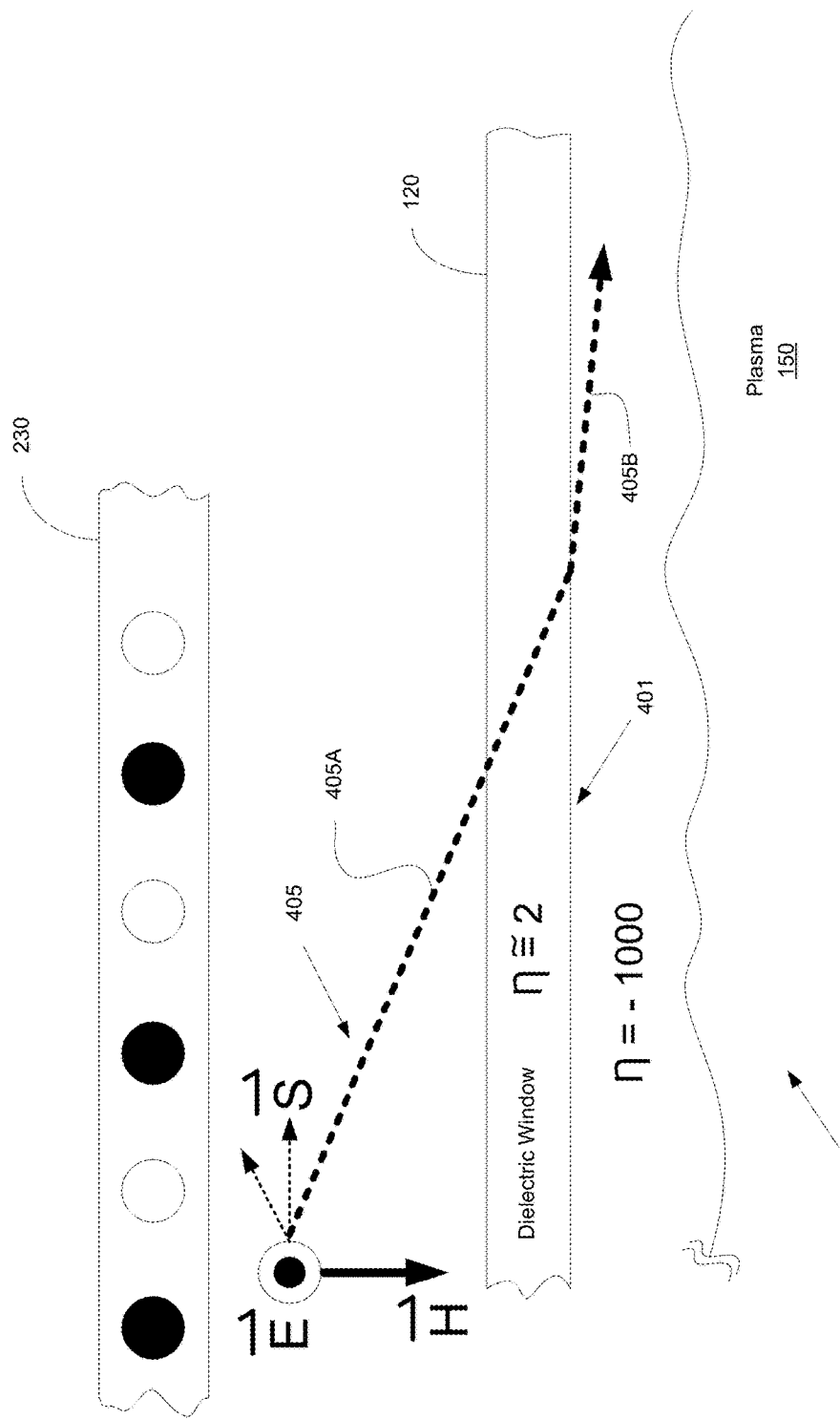
FIG. 4A illustrates the penetration of the S-field through the plasma-window interface to perform RF surface wave coupling with the plasma, in accordance with one embodiment of the present disclosure.

FIG. 4A illustrates the penetration of the S-field (Poynting wave) through the plasma-window interface 401 to perform RF surface wave coupling with the plasma, in accordance with one embodiment of the present disclosure. As previously described, the GQA 230 produces an electromagnetic field passing through the window 120 as a surface wave along the plasma-window interface 401, the surface wave exciting and ionizing the at least one process gas to generate plasma within the chamber. As previously described, the E (electric field) is tangential to the coils of the GQA 230, and lies in the plane of GQA 230. For example, depending on which point on a corresponding coil, the E (electric field) may go into the page, come out of the page (as shown in FIG. 4A), or be in any direction along the plane defining the coils of the GQA 230. FIG. 4A illustrates one E (electric field) at a particular point on the GQA 230. The power-coupling intermediary is the magnetic field (H-field) of the planar spiral antenna to generates and/or excites the plasma. For the vector of the E (electric field) shown in FIG. 4A, the B-field is perpendicular to the E (electric field) (e.g., pointing downwards and traveling through window 120). The B-fields at any point on the coil of GQA 230 are similarly directed into the plasma chamber 101 through window 120.

The plasma 150 in chamber 101 is sustained through RF surface-wave coupling. In particular, the intermediary for an RF SWP is the near-field Poynting vector. The Poynting vector represents the directional energy flux of an electromagnetic field and has units of watts per meter squared ($W/m^2$). The Poynting vector has units of Watts/$m^2$, wherein watt is a representation of energy flow rate. The Poynting vector is represented by Equation 3, below.

$$S(r,t) = E(r,t) \times H(r,t) \quad (3)$$

More particularly, FIG. 4A shows the Poynting (S) vector 405 generated from the E (electric field) and the H (magnetic field) near the GQA 230. The direction of the Poynting vector 405 is nearly parallel to the plane of the GQA 230 but may vary. For example, the Poynting vector 405 may be slightly oriented upwards away from window 120, be parallel to window 120, or be slightly oriented downwards towards window 120. In addition, housing 102 may act to redirect or reflect the S-field vectors back down into the plasma chamber 101. Importantly, the Poynting vectors oriented downwards having shallow angles with respect to the plane of window 120 are refracted at the plasma-window interface 401. That is, the index of refraction of the window 120 is approximately 2 (e.g., $\eta=2$ from a permittivity of approximately 4), in one implementation. On the other hand, the index of refraction of the plasma 150 that is generated (e.g., from the H (magnetic field)) within the plasma chamber 101 is negative one-thousand (e.g., $\eta=-1000$), an imaginary number. As a result, the section 405A of the Poynting wave 405 having a shallow angle entering the window 120 is refracted such that section 405B of the Poynting wave emerges from window 120 and is directed along the plasma-window interface 401.

The uniform Poynting vector (S=E×H) near-field couples into the plasma 150 to heat the plasma. That is, energy density is constant at steady state, and the S-field (Poynting vector) is the source of plasma heating and powers the plasma 150. In particular, the E×H vectors have large components in the plane of the GQA 230 (hence, the plane of the plasma-window interface), allowing the wave vectors (S) appropriate access to become the (plasma-window) surface waves. Plasma 150 is then heated through RF Surface Wave coupling. Equation 4 below represents the power per unit volume lost into the ambient plasma 150, such as for plasma heating. Because the S-field is also uniform (e.g., due to the uniform E (electric field) and H (magnetic field)), the near-field power couples into the plasma throughout the entire footprint of the GQA 230. Also, a Faraday shield is not needed since the GQA 230 is located so far away from the window 120, in one embodiment.

$$-j \cdot E = \frac{\partial w}{\partial t} + \nabla \cdot S \quad (4)$$

Figure 4C:
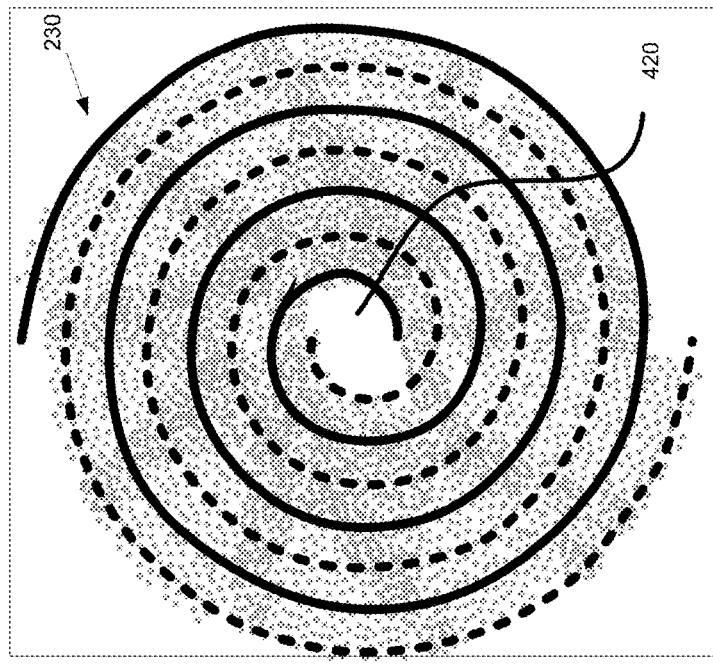
FIG. 4C illustrates an S-field signature (Poynting vector) of an RF GQA, in accordance with one embodiment of the present disclosure.
Figure 4B:
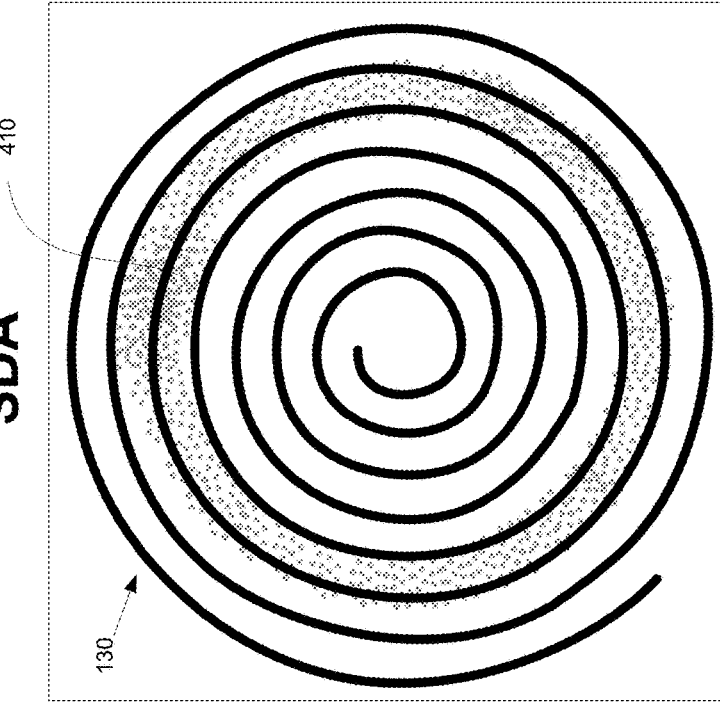
FIG. 4B illustrates an S-field signature (Poynting vector) of an RF SDA, in accordance with one embodiment of the present disclosure. Poynting vector (S=E×H).

FIGS. 4B-4C provide S-field signatures for the RF SDA 130 and the GQA 230 for comparison purposes. In particular, FIG. 4B illustrates an S-field signature 400B (Poynting vector S=E×H) of the RF SDA 130, in accordance with one embodiment of the present disclosure. As shown, the RF SDA 130 radiates in the high-current region (i.e., the I-dot contribution from real current) producing the nonuniform near-field Poynting Vector. In particular, the near-field of the dipole radiation has strong signature (concentration) in the high current region (a ring, which is near the center portion of the dipole antenna) from the real current, and because there is essentially no displacement current radiation for RF SDA 130. As the E×H near-field couples into the plasma, it heats the plasma in the donut region 410 producing the usual M-shape Ne(r) (e.g., of FIG. 1D) like that of the single-coil TCP/IP.

In comparison, FIG. 4C illustrates an S-field signature 400C (Poynting vector) of the GQA 230, in accordance with one embodiment of the present disclosure. The concentration and the uniformity of GQA 230 S-field is evident in FIG. 4C. As shown, the S-field strength and concentration of that strength is uniform throughout the footprint of the GQA 230, except for hole 420, as described below. As previously described, the GQA 230 has contributions from both the real and displacement currents to generate corresponding Poynting vectors. In particular, around the low-current portion of the SDAs 240 and 250 (e.g., high-voltage parts that are 180 degrees out-of-phase), E (electric fields) will radiate by the displacement current term of the Maxwell-Ampere Equation. Also, E (electric fields) will radiate in the interior of the GQA 230 from the real current term of the Maxwell-Ampere Equation. In that manner, a spatially uniform near-field Poynting vector will be obtainable (e.g., through radiation by E-dot+I-dot), as is shown in FIG. 4C. For example, the "Counter Current Array" condition for the GQA 230 is for both the real current (I) region (e.g., center where E is high) and the displacement current (E) regions (the two end or tip regions where E is weak). In that manner, the H (magnetic fields) and E (electric fields) are uniformly localized, which is good for small-volume plasma uniformity. In general, FIG. 4C shows that there is minimum angular change of E-dot+I-dot.

As shown in FIG. 4C, there is a small "hole" 420 in the center tips-region where E is weak but the S uniformities are excellent for the remaining center tips-region (displacement current region) and the entire real current region. The outside tips-region's displacement current radiation is relatively less uniform. This null region may be due to the spiraling-out geometry of the galaxy. In particular, where the lines are better matched (i.e., the center tips-region), angular change of E-dot+I-dot is small (e.g., uniform) since the 2 lines are 180-degree out (i.e., "Counter Current Array" condition). On the other hand, the lines become less matched as they spiral out beyond the real-current region and as a result, the angular change of E-dot+I-dot becomes large (less uniform).

The increasing physical line-mismatch from center-region to the galaxy-arm, causes the increasing angular-change of E-dot+I-dot. This is because of the 180 degree out-of-phase and equal-power implementation. In one embodiment, using a different phase (e.g., equal-power), such as for example purely for illustration, 150 degrees out-of-phase, the angular-change of Edot+I-dot could become minimum at the galaxy-arm, and increase towards the center. In that manner, a uniform time-average S from center to the galaxy-arm is then obtainable through sinusoidal-oscillation of the phase within this value-range, in one embodiment. As such, dynamically changing (e.g., during operation) the phases (e.g., using variable phase inputs) of the antennas provides another tuning mechanism, in one embodiment. The same could be applied to their powers, achieving the same, in embodiments.

The drawback of the GQA 230 is the increasing line-match; its benefit is the locations of the powerfeed/ground-strap for the 2 dipoles are physically 180-degree away. There is a strong E (electric field) in the powerfeed/ground-strap region, which is evident in FIG. 4B Poynting Vector magnitude plot for the SDA 130 in region 410. For the GQA 230, since the E (electric field) between the two antennas (e.g., SDAs) is strong, the E (electric field) distortion caused by the power-feed/ground-strap region is not as noticeable. This demonstrates the benefit of the 180-degree physical separation of the GQA's power-feed/ground-strap setup, as is shown in FIG. 2B. It should be noted that because of the 180 degree out-of-phase for the antennas (e.g., SDA 240 and 250) of the GQA 230, not only is the voltages for the two power-feeds 180 degrees out-of-phase, the inductive-voltages for the two ground-straps' are also 180 degrees out-of-phase (e.g., because the ground-strap is at DC-ground and still poses a large inductive impedance at the RF frequency used).

Figure 4D:
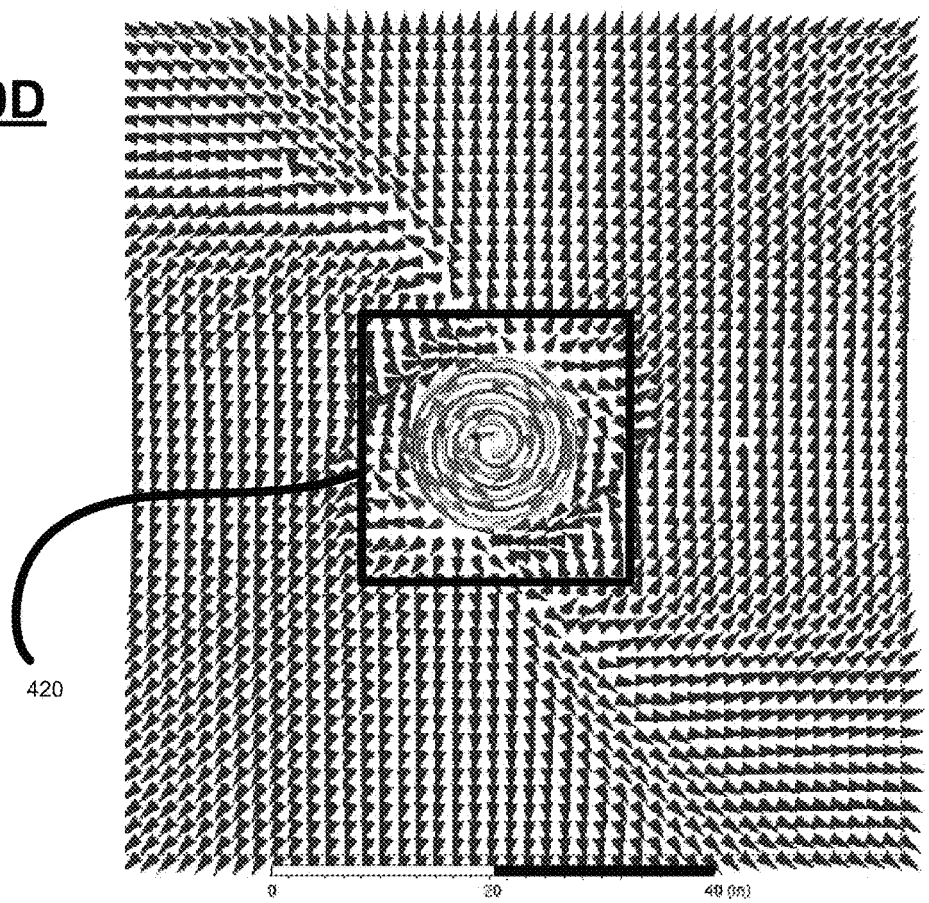
FIG. 4D illustrates the near-field wave vectors of the Poynting vector for an RF GQA, in accordance with one embodiment of the present disclosure. just shows the same vector plot with zoom-in, and at the same total power.
Figure 4E:
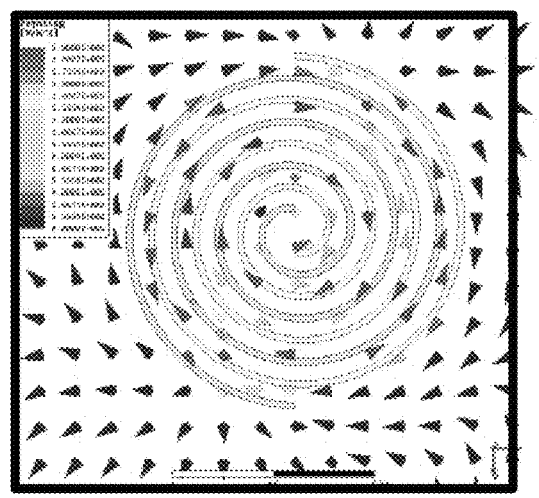
FIG. 4E illustrates an expansion of the center of the near-field wave vectors of the Poynting vector for an RF GQA shown in FIG. 2H, in accordance with one embodiment of the present disclosure.

FIGS. 4D-4E show the resulting Poynting Vector magnitudes for the GQA 230 as a vector plot, in embodiments of the present disclosure. For example, the radiation boundary is a large 80"×80" square Earth, for purposes of illustration. In particular, FIG. 4D illustrates the near-field wave vectors of the Poynting vector for the GQA 230, in accordance with one embodiment of the present disclosure. As previously described, the GQA 230 has superior uniformity (e.g., more uniform and concentrated S) in their near-field Poynting vectors over that of the RF SDA 130. In particular, the wave vectors (S) have large components in the antenna plane (i.e., the plane of the plasma-window interface 401 which also corresponds to the highlight box 420), which is advantageous for surface wave generation.

FIG. 4E illustrates an expansion of the highlight box 420 (e.g., center region) of the near-field wave vectors of the Poynting vector for a GQA 230 shown in FIG. 4D. The highlight box 420 corresponds to the ends of the GQA 230, which has contributions from the displacement current, even though there is a weak E (electric field). In highlight box 420, the Poynting vector (S) is much more concentrated and more uniform than that of SDA 130 (which has no wave vectors in a corresponding center region). In particular, the wave vectors (e.g., arrows) of S is present in highlight box 420 and indicates a strong component in the plane of the antennas (i.e., plasma interface).

Figure 5A:
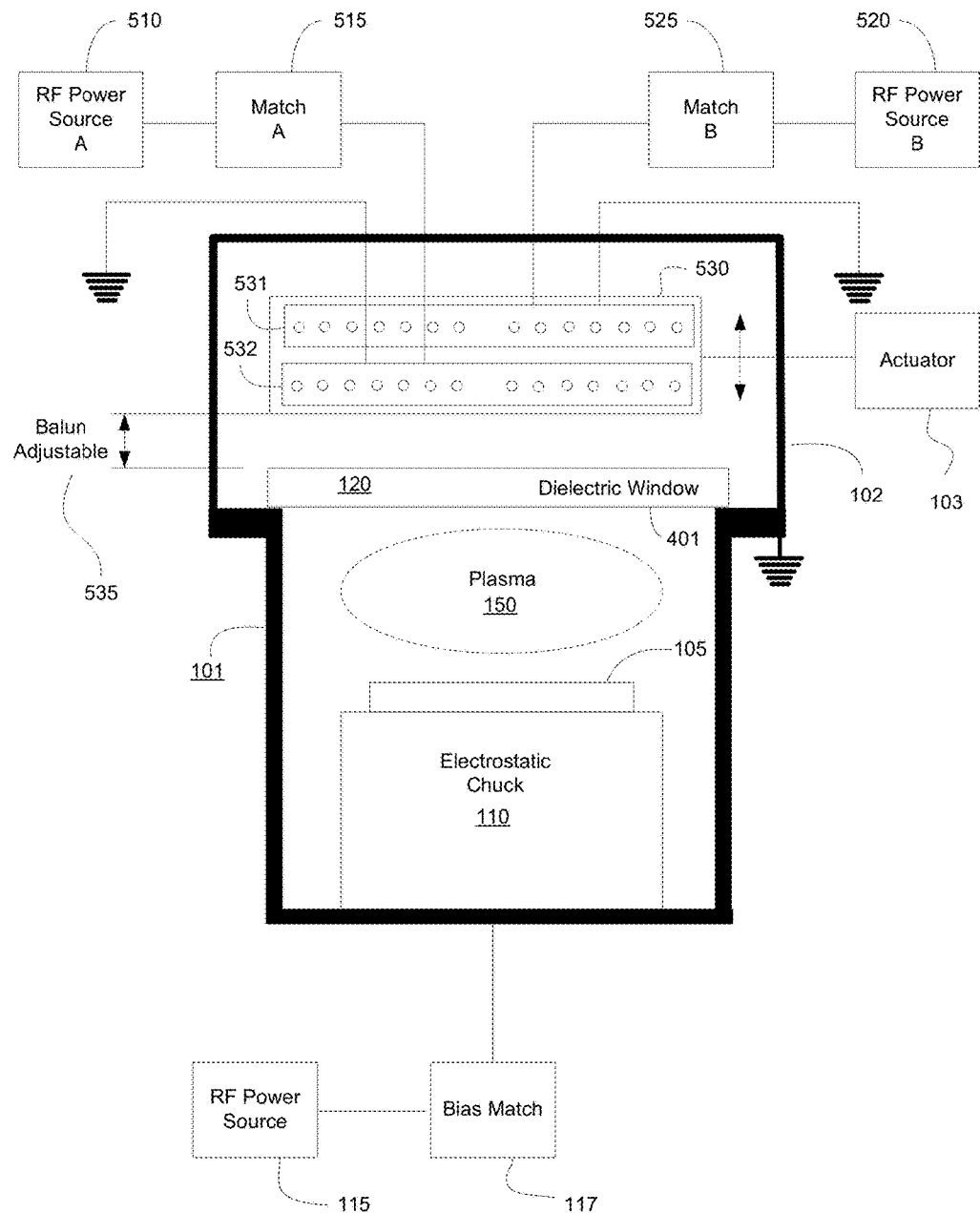
FIG. 5A illustrates an example of a plasma reactor system including an RF stacked-dipole quadrupole antenna (SQA) having two SDAs stacked in separate parallel planes that is configured for generating a uniform near-field Poynting vector, in accordance with one embodiment of the present disclosure.

FIG. 5A illustrates an example of a plasma reactor system 500A including an RF stacked-dipole quadrupole antenna 530 (SQA 530) including two SDAs 531 and 532 stacked in separate parallel planes (i.e., when combined create a quadrupole antenna) that is configured for generating a uniform near-field Poynting vector, in accordance with one embodiment of the present disclosure. RF SQA 530 operates with the same principles and operational parameters (e.g., counter current, out-of-phase, like frequencies, different frequencies, same power, different powers, spiraling in the same direction, spiraling in opposite directions, aligned ends of spirals, unaligned ends of spirals, etc.) as the previously described GQA 230 in producing a uniform near-field (e.g., S-field), and as such is not fully described and relies on the description for GQA 230. As will be shown below, RF SQA 530 may achieve the same goals as GQA 230 (e.g., both provide radiation at the high current regions (e.g., center) and at the tips (e.g., high voltage fields/regions), consistent with FIG. 2C), and with improved results.

Plasma reactor system 500A is configured for generating plasma 150 in chamber 101. Generally, plasma reactor system 200A may be similarly configured as the plasma reactor systems 100A and 200A of FIG. 1A and FIG. 2A but includes a different antenna—RF SQA 530. For example, plasma reactor system 200A may be utilized for etching operations and other processing operations, in embodiments. In particular, system 500A includes plasma chamber 101 for processing a substrate 105 disposed on substrate support 110 (e.g., chuck). For example, the substrate may be a wafer placed into the plasma chamber for processing. During processing, a process gas supply (not shown) is configured for introducing at least one process gas into the plasma chamber. Pumps (not shown) are connected to plasma chamber 101 to enable vacuum control and removal of gaseous byproducts from plasma chamber 101 during processing. Plasma chamber 101 may be coupled to facilities including plumbing to provide processing gasses, vacuum, temperature control, and environmental particle control. Plasma chamber 101 may operate at elevated temperatures and under vacuum, as previously described. Also, system 500A includes a bias RF generator 115 defined as one or more generators operating at one or more frequencies. Bias match 117 is coupled between RF generator(s) 115 and a conductive plate that defines the chuck 110. Control systems (not shown) may lift off from and/or place onto the substrate support 110 the substrate 105. Dielectric window 120 that is oriented over the substrate support 110.

Figure 5B:
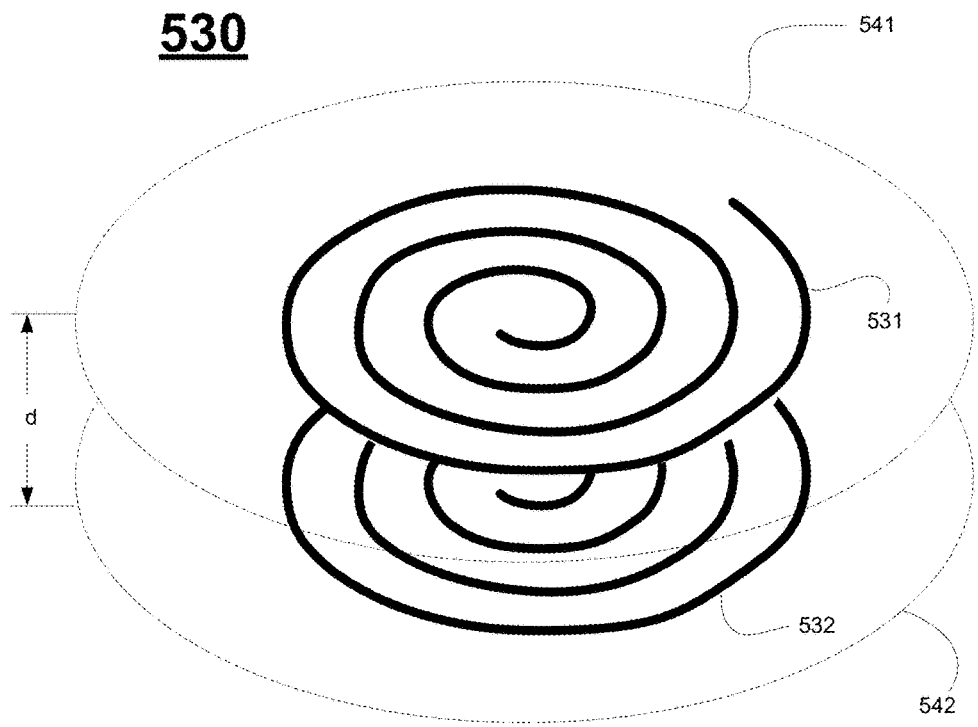
FIG. 5B illustrates a stacked RF SQA, in accordance with one embodiment of the present disclosure.

System 500A includes the RF SQA 530 disposed over the dielectric window 120, wherein system 500A includes a first spiral dipole antenna (SDA) 531 and a second SDA 532 in a stacked configuration, as also further shown in FIG. 5B. In one embodiment, the directions (e.g., clock or counter-clock) of spirals in SDAs 531 and 532 are identical. In another embodiment, the directions (e.g., clock or counter-clock) are opposite, with corresponding adjustments to phase for the SDAs 531 and 532 and/or other parameters for achieving appropriate E (electric fields) at the ends of the SDAs 531 and 532 (e.g., see FIG. 2C). The SQA 530 may be contained within an upper housing 102 that is positioned above the plasma chamber 101. Each of the first and second SDAs in SQA 530 is coupled to a respective RF matching circuit and RF power source. For example, the first SDA 531 may be coupled to RF matching circuit 515 and RF power source (e.g., RF generator) 510 configured to provide a first RF signal at a frequency to the first SDA 531. In addition, the second SDA 532 may be coupled to RF matching circuit 525 and RF power source 520 configured for providing a second RF signal at the same frequency to the second SDA 532, in one embodiment. In other embodiments, different frequencies power the individual SDAs of the SQA 530.

The SQA 530 is disposed at a separation 535 from window 120. In particular, actuator 103 is connected to the SQA 530 to provide vertical motion with respect to the dielectric window 120, such that the z-direction location of the antenna-set (e.g., SQA 530) is tuned relative to the ground plane, which is parallel to the window 120. For example, by varying the separation 535, the impedance of the SQA 530 can be tuned to match the impedance of RF power delivery system delivering power to the SQA 530. For example, the separation 535 is tuned to perform impedance matching between the first RF power supply 510 and the first SDA 531 and the second RF power supply 520 and the second SDA 531. In particular, the balun separation 535 is tuned or adjusted to adjust the real component of the impedance of the SQA 530, as previously described. The imaginary component can be adjusted through the one or more locations of the one or more power connections on the SQA 530. In embodiments, the separation 535 is within a range between 0.1 to 4.0 meters. In other embodiments, the separation 535 is within a range between 0.4 to 3.0 meters. In still other embodiments, the separation 535 is within a range between 0.1 to 2.0 meters. In other embodiments, the separation 535 is within a range between 0.4 to 1.0 meters.

As shown, the first SDA 531 is defined by a first coil including one or more turns, and the second SDA 532 is defined by a second coil including one or more turns. The first SDA 531 is disposed over the second SDA 532, such that corresponding turns of the first and second SDAs 531 and 532 are aligned over the dielectric window 120. For example, corresponding outer turns of the first SDA 531 and the second SDA 532 are aligned over the dielectric window 120. Further, in one embodiment, the ends of the first and second SDAs 531 and 532 are aligned over the dielectric window 120. That is, the interior turns are aligned with each other and/or the exterior turns are aligned with each other. In another embodiment, the ends of the first and second SDAs 531 and 532 are offset (e.g., 180 degrees offset). That is, the interior turns are unaligned with each other and/or the exterior turns are unaligned with each other.

As shown in FIG. 5B, the first SDA 531 is separated from the second SDA 532 by a distance "d". More particularly, in one embodiment, the first SDA 531 and the second SDA 532 are vertically separated, such that the first SDA 531 is in a first plane 541 and the second SDA 532 is in a second plane 542. The first and second planes are substantially parallel. Purely for example, the separation "d" is 1 inch.

In one embodiment, the RF SQA 530 exhibits perfect line-matching throughout the lengths of the SDAs 531 and 532 (e.g., from tips to tips all the way from the very-center to the outside edge). In one example, SQA 530 includes two SDAs 531 and 532 in the same 300 mm wafer footprint, wherein the SDAs 531 and 532 are configured for (e.g., diameter size of antenna) operating at 27.12 Mhz. With the perfect line-match for the SQA 530, the two SDAs 531 and 532 can be fixed at 180 degrees out-of-phase, and having equal-power (e.g., 0.5 kW excitation), in one embodiment.

Figures 1, 5B:
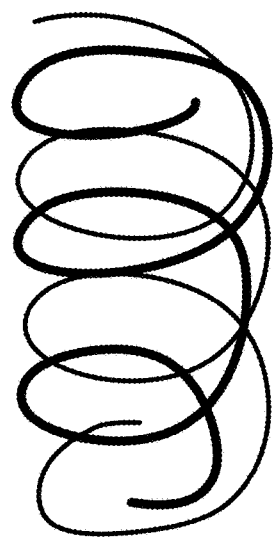

FIG. 5B-1 is an illustration of a stacked-dipole quadrupole antenna (SQA) 530A that includes intertwined dipole spiral antennas that are stretched out, in accordance with one embodiment of the present disclosure. For example, SQA 530A may be formed from the GQA 230, wherein ends of the individual SDAs forming GQA 230 are vertically lifted and the diameter of each of the coils is made uniform so that SQA 530A has a uniform diameter throughout the stack. For example, end 250A of SDA 250 and end 240A of SDA 240 are vertically lifted to form SQA 530A. In addition, corresponding pairs of points of the two SDAs 240 and 250 are of the same distance. The SQA 530A provides radiation at the high current regions (e.g., center) and at the tips (e.g., high voltage fields/regions), consistent with FIG. 2C.

Figures 2, 5B:
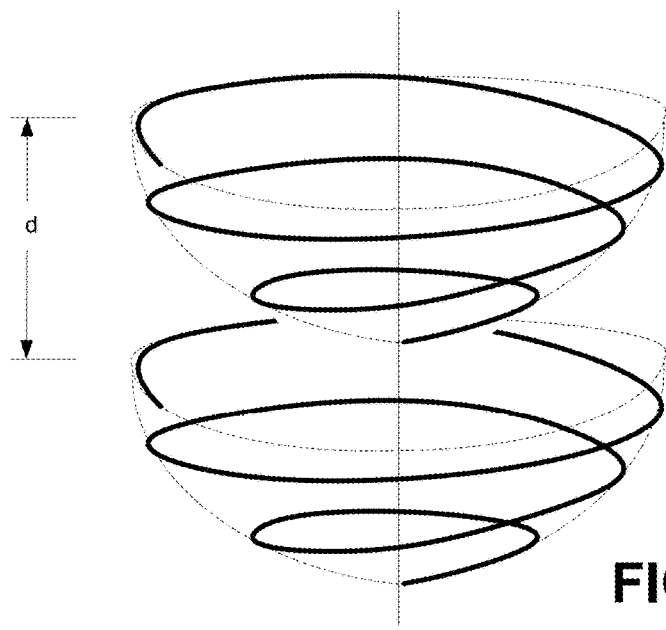
Figures 3, 5B:
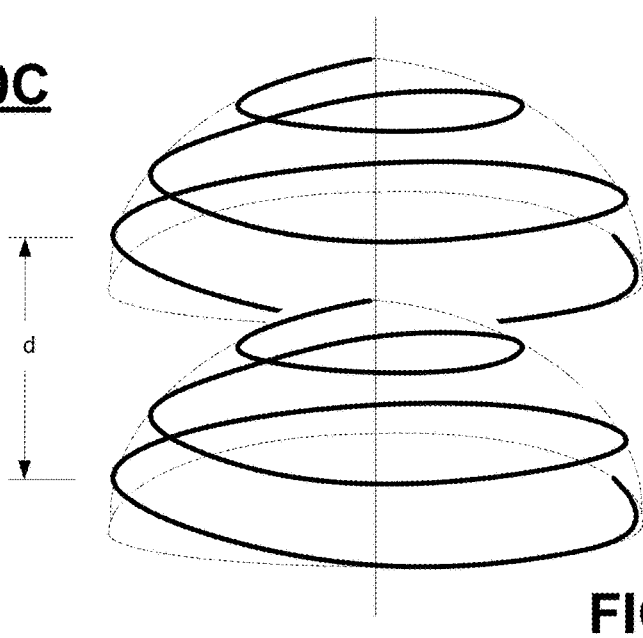

FIG. 5B-2 is an illustration of a stacked-dipole quadrupole antenna (SQA) 530B that includes two dipole spiral antennas that are stacked, wherein each dipole spiral antenna is in a concave-up configuration, in accordance with one embodiment of the present disclosure. In addition, corresponding pairs of points of the two dipole antennas are of the same distance, such that each antenna in the stack is similarly configured. The SQA 530B provides radiation at the high current regions (e.g., center) and at the tips (e.g., high voltage fields/regions), consistent with FIG. 2C. FIG. 5B-3 is an illustration of a stacked-dipole quadrupole antenna (SQA) 530C that includes two dipole spiral antennas that are stacked, wherein each dipole spiral antenna is in a concave-down configuration, in accordance with one embodiment of the present disclosure. In addition, corresponding pairs of points of the two dipole antennas are of the same distance, such that each antenna in the stack is similarly configured. The SQA 530C provides radiation at the high current regions (e.g., center) and at the tips (e.g., high voltage fields/regions), consistent with FIG. 2C.

Figure 5C:
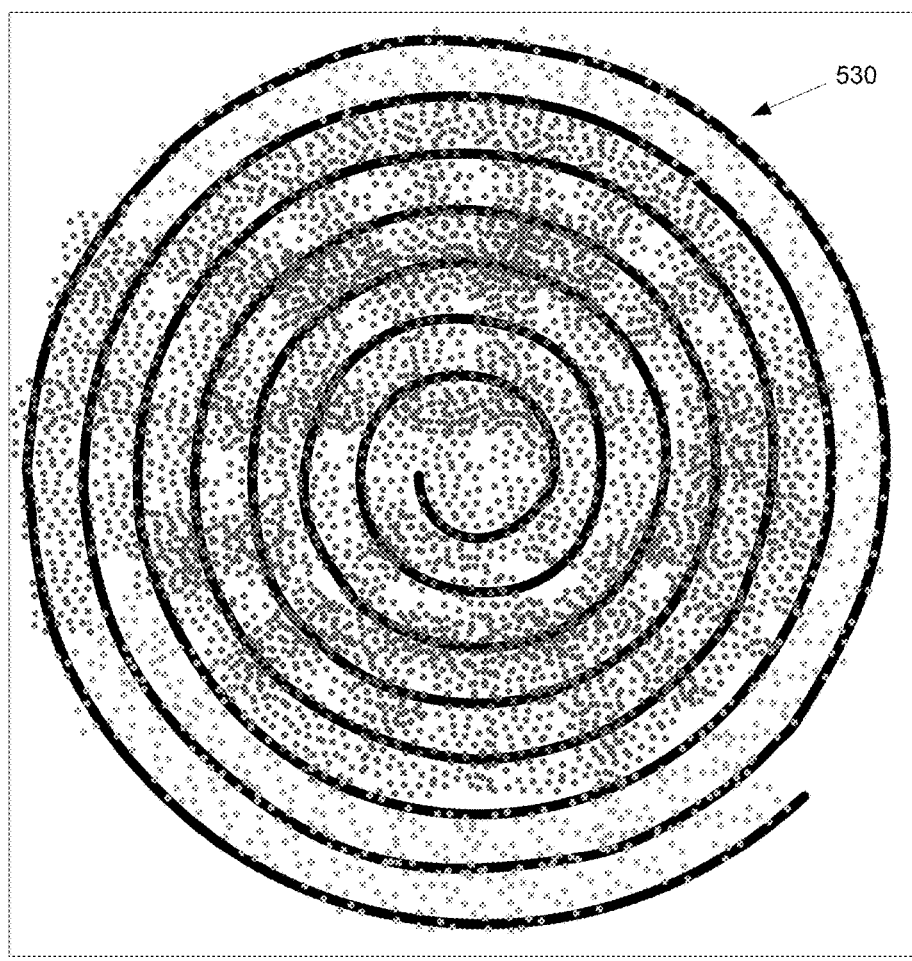
FIG. 5C illustrates the near-field wave vectors of the Poynting vector for an RF SQA having two stacked spiral dipole antennas, in accordance with one embodiment of the present disclosure. just shows the same vector plot with zoom-in, and at the same total power.

FIG. 5C illustrates an S-field signature 500C (Poynting vector magnitude plot) of the RF SQA 530, in accordance with one embodiment of the present disclosure. For example, the S-field signature 500C illustrates the near-field wave vectors of the Poynting vector for the RF SQA 530 having two stacked spiral dipole antennas. The perfect line-match for the RF SQA 530 can fully take advantage of the 180 degree out-of-phase and equal-power implementation to produce a uniform near-field Poynting vector plot. For purposes of illustration, the two RF SDAs 531 and 532 are powered 180° out, 0.5 kW-each, and at 27 MHz. Since lines of the two 1 inch spaced stacked SDAs are matched turn-to-turn in a "Counter Current Array", there is not a radiation "hole" in the center, and there is no angular (turn-to-turn) change of E-dot+I-dot (i.e., providing uniformity). In one embodiment, dynamically tuning the phases of the stacked SDAs (e.g., other than 180 degrees out-of-phase) during operation provides for Poynting vector uniformity.

The S-field of the RF SQA 530 is more uniform and more concentrated than the RF SDA 130A. As such, there is a large component of the wave vector (S) in the plane of the plasma-window interface 401 (e.g., parallel to the antenna plane), which is good for surface wave generation. Moreover, the S-field of the RF SQA 530 is improved over the S-field of the GQA 230 (shown in FIG. 4C). In particular, because of the perfect line-match for the RF SQA 530, there is no center hole where the S-field is absent, as is exhibited by the center hole 420 for the GQA 230 shown in FIG. 4C. That is, the center hole is totally gone in FIG. 5C. More particularly, the entire center region and the high-current region of the RF SQA 530 has a more uniform S-field. This may be due to the proximity of two ground-straps for the SDAs 531 and 532 of the RF SQA 530, wherein a strong E-dot between the two ground-straps produces a strong S throughout the entire footprint of the RF SQA 530. In addition, the strength of the S-field may be stronger throughout the footprint of the RF SQA 530, when compared to the GQA 230.

Figure 6:
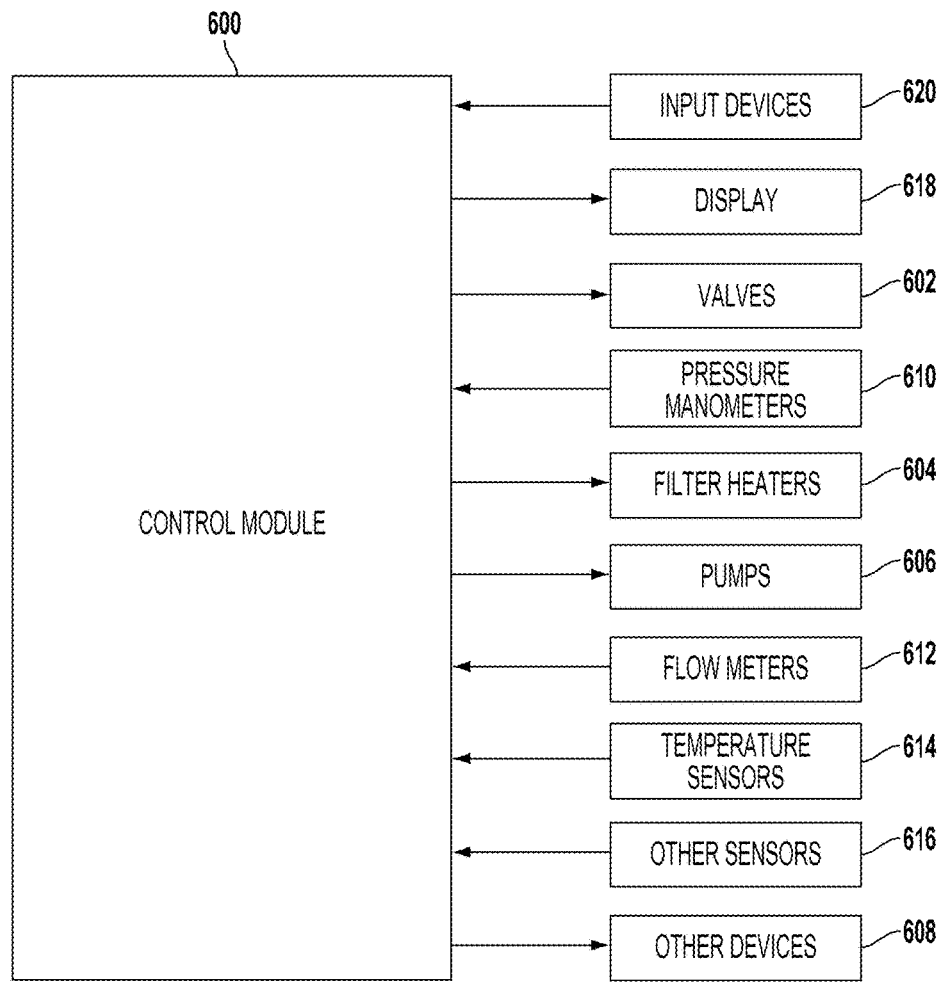
FIG. 6 shows a control module for controlling the systems described above.

FIG. 6 shows a control module 600 for controlling the systems described above. For instance, the control module 600 may include a processor, memory and one or more interfaces. The control module 600 may be employed to control devices in the system based in part on sensed values. For example only, the control module 600 may control one or more of valves 602, filter heaters 604, pumps 606, and other devices 608 based on the sensed values and other control parameters. The control module 600 receives the sensed values from, for example only, pressure manometers 610, flow meters 612, temperature sensors 614, and/or other sensors 616. The control module 600 may also be employed to control process conditions during precursor delivery and deposition of the film. The control module 600 will typically include one or more memory devices and one or more processors.

The control module 600 may control activities of the precursor delivery system and deposition apparatus. The control module 600 executes computer programs including sets of instructions for controlling process timing, delivery system temperature, and pressure differentials across the filters, valve positions, mixture of gases, chamber pressure, chamber temperature, substrate temperature, RF power levels, substrate chuck or pedestal position, and other parameters of a particular process. The control module 600 may also monitor the pressure differential and automatically switch vapor precursor delivery from one or more paths to one or more other paths. Other computer programs stored on memory devices associated with the control module 600 may be employed in some embodiments.

Typically there will be a user interface associated with the control module 600. The user interface may include a display 618 (e.g., a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors, and thermocouples located in delivery system, the pedestal or chuck, and state sensor, etc. Appropriately programmed feedback and control algorithms may be used with data from these sensors to maintain desired process conditions. The foregoing describes implementation of embodiments of the disclosure in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. An apparatus for generating plasma, comprising:
a quadrupole antenna having a center region and an outer region and configured to be disposed over a dielectric window of a plasma chamber, the quadrupole antenna including a first coil defining a first spiral dipole antenna (SDA) and a second coil defining a second SDA, the first coil being in a nested arrangement within the second coil,
wherein the nested arrangement places a turn of the first coil to be adjacent to a corresponding turn of the second coil as the first and second coils spiral from the center region to the outer region,
wherein adjacent turns of each of the first and second coils are horizontally separated from one another by a distance when disposed over the dielectric window.

2. The apparatus of claim 1,
wherein the first SDA is continuous from end-to-end and includes a first center point connected to ground,
wherein the second SDA is continuous from end-to-end and includes a second center point connected to ground, and
wherein the first center point of the first SDA is oriented 180 degrees from the second center point of the second SDA.

3. The apparatus of claim 2, further comprising:
wherein the first SDA is configured to receive a first radio frequency (RF) signal at a frequency from a first RF power source at a first near distance to the first center point via a first slidable connection, the first near distance tunable for impedance matching between the first RF power source and the first SDA,
wherein the second SDA is configured to receive a second RF signal at the frequency from a second RF power source at a second near distance to the second center point via a second slidable connection, the second near distance tunable for impedance matching between the second RF power source and the second SDA.

4. The apparatus of claim 3, wherein each of the first SDA and the second SDA has a length approximately equal to half the wavelength corresponding to the frequency of the first RF signal and the second RF signal.

5. The apparatus of claim 3,
wherein the first RF signal and the second RF signal are out-of-phase, and
wherein the quadrupole antenna is configured as a counter current array, such that the first RF signal resonates a first RF current in the first SDA, and the second RF signal resonates a second RF current in the second SDA that is counter to the first RF current.

6. The apparatus of claim 5, wherein the first RF signal and the second RF signal are 180 degrees out-of-phase.

7. The apparatus of claim 3, wherein the first RF signal and the second RF signal have equal powers.

8. The apparatus of claim 1, wherein the quadrupole antenna is disposed over the dielectric window by a separation that is tunable for impedance matching.

9. The apparatus of claim 1, further comprising:
an actuator coupled to the quadrupole antenna and configured to adjust a separation between the quadrupole antenna and the dielectric window to perform impedance matching between a first RF power source and the first SDA and a second RF power source and the second SDA.

10. The apparatus of claim 1,
wherein corresponding ends of the first SDA and the second SDA in combination radiate a displacement current,
wherein the quadrupole antenna produces an electromagnetic field passing through the dielectric window as a surface wave along a plasma-window interface, the surface wave exciting and ionizing at least one process gas to generate plasma within the plasma chamber.

11. An apparatus for generating plasma, comprising:
a quadrupole antenna configured to be disposed over a dielectric window of a plasma chamber, the quadrupole antenna including a first coil defining a first spiral dipole antenna (SDA) and a second coil defining a second SDA,
wherein the first SDA and the second SDA are vertically separated by a distance, such that the first SDA is in a first plane and the second SDA is in a second plane that is parallel to the first plane.

12. The apparatus of claim 11,
wherein the first SDA is disposed over the second SDA such that corresponding outer turns of the first SDA and the second SDA are aligned over the dielectric window.

13. The apparatus of claim 12, wherein the first SDA and the second SDA each spiral from a center region of the quadrupole antenna in a same clockwise or counter-clockwise direction.

14. The apparatus of claim 11,
wherein the first SDA is continuous from end-to-end and includes a first center point connected to ground, and
wherein the second SDA is continuous from end-to-end and includes a second center point connected to ground.

15. The apparatus of claim 14,
wherein the first SDA is configured to receive a first radio frequency (RF) signal at a frequency from a first RF power source at a first near distance to the first center point via a first slidable connection, the first near distance tunable for impedance matching between the first RF power source and the first SDA, and
wherein the second SDA is configured to receive a second RF signal at the frequency from a second RF power source at a second near distance to the second center point via a second slidable connection, the second near distance tunable for impedance matching between the second RF power source and the second SDA.

16. The apparatus of claim 15, wherein each of the first SDA and the second SDA has a length approximately equal to half the wavelength corresponding to the frequency of the first RF signal and the second RF signal.

17. The apparatus of claim 15,
wherein the first RF signal and the second RF signal are out-of-phase,
wherein the quadrupole antenna is configured as a counter current array, such that the first RF signal resonates a first RF current in the first SDA, and the second RF signal resonates a second RF current in the second SDA that is counter to the first RF current.

18. The apparatus of claim 17,
wherein the first RF signal and the second RF signal are 180 degrees out-of-phase.

19. The apparatus of claim 15, wherein the first RF signal and the second RF signal have equal powers.

20. The apparatus of claim 15, wherein the quadrupole antenna is disposed over the dielectric window by a separation that is tunable for impedance matching.

21. The apparatus of claim 11, further comprising:
an actuator coupled to the quadrupole antenna and configured to adjust a separation between the quadrupole antenna and the dielectric window to perform impedance matching between a first RF power supply and the first SDA and a second RF power supply and the second SDA.

22. The apparatus of claim 11,
wherein corresponding ends of the first SDA and the second SDA in combination radiate a displacement current,
wherein the quadrupole antenna produces an electromagnetic field passing through the dielectric window as a surface wave along a plasma-window interface, the surface wave exciting and ionizing at least one process gas to generate plasma within the plasma chamber.

* * * * *